(12) United States Patent
Yoshizawa et al.

(10) Patent No.: US 10,361,348 B2
(45) Date of Patent: Jul. 23, 2019

(54) SPOT LIGHTING APPARATUS

(71) Applicant: MITSUBISHI CHEMICAL CORPORATION, Chiyoda-ku (JP)

(72) Inventors: Kouta Yoshizawa, Odawara (JP); Akeo Kasakura, Odawara (JP)

(73) Assignee: MITSUBISHI CHEMICAL CORPORATION, Chiyoda-ku (JP)

( * ) Notice: Subject to any disclaimer, the term of this patent is extended or adjusted under 35 U.S.C. 154(b) by 0 days.

(21) Appl. No.: 15/600,261

(22) Filed: May 19, 2017

(65) Prior Publication Data

US 2017/0256693 A1 Sep. 7, 2017

Related U.S. Application Data

(63) Continuation of application No. PCT/JP2015/064648, filed on May 21, 2015.

(30) Foreign Application Priority Data

Nov. 19, 2014 (JP) ................................. 2014-234629
Apr. 13, 2015 (JP) ................................. 2015-081735

(51) Int. Cl.
*F21V 7/09* (2006.01)
*F21V 7/04* (2006.01)
(Continued)

(52) U.S. Cl.
CPC ............ *H01L 33/60* (2013.01); *F21V 7/0041* (2013.01); *F21V 7/06* (2013.01); *F21V 7/09* (2013.01);
(Continued)

(58) Field of Classification Search
CPC .. F21V 7/06–09; F21V 7/0025; F21V 7/0033; F21V 7/0041
(Continued)

(56) References Cited

U.S. PATENT DOCUMENTS 6,637,921 B2 * 10/2003 Coushaine ............ F21V 7/0008
362/517
6,758,582 B1 7/2004 Hsiao et al.
(Continued)

FOREIGN PATENT DOCUMENTS

CN 102116430 7/2011
CN 102374488 A1 3/2012
(Continued)

OTHER PUBLICATIONS

Notification of Transmittal of Translation of the International Preliminary Report on Patentability and Written Opinion dated Jun. 1, 2017 in PCT/JP2015/064648.
(Continued)

*Primary Examiner* — Sean P Gramling
*Assistant Examiner* — Keith G. Delahoussaye
(74) *Attorney, Agent, or Firm* — Oblon, McClelland, Maier & Neustadt, L.L.P.

(57) ABSTRACT

A spot lighting apparatus includes a first reflection unit, a semiconductor light emitting device, a second reflection unit being provided on an optical axis of the semiconductor light emitting device, and a fixing unit fixing the second reflection unit to be separated from the semiconductor light emitting device, wherein the second reflection unit receives a part of a light released from the semiconductor light emitting device and reflects it toward the first reflection unit, the first reflection unit receives a part of a light released from the semiconductor light emitting device and all or a part of a light reflected on the second reflection unit and reflects them toward the opening part, and the light reflected on the first reflection unit and emitted from the opening part is 80% or more of total lights emitted from the opening part.

24 Claims, 10 Drawing Sheets

(51) Int. Cl.
*H01L 33/60* (2010.01)
*F21V 29/74* (2015.01)
*F21V 7/06* (2006.01)
*F21V 7/00* (2006.01)
*F21Y 115/00* (2016.01)
*H01L 25/075* (2006.01)
*F21V 29/10* (2015.01)
*F21Y 115/10* (2016.01)

(52) U.S. Cl.
CPC .............. *F21V 29/74* (2015.01); *F21V 29/10* (2015.01); *F21Y 2115/00* (2016.08); *F21Y 2115/10* (2016.08); *H01L 25/0753* (2013.01); *H01L 2224/16* (2013.01)

(58) Field of Classification Search
USPC ........................................ 362/217.04–217.06
See application file for complete search history.

(56) References Cited

U.S. PATENT DOCUMENTS

| | | | | |
|---|---|---|---|---|
| 7,703,945 | B2* | 4/2010 | Leung | ................... F21V 7/0008 257/98 |
| 8,258,532 | B2 | 9/2012 | Van Gorkom et al. | |
| 9,726,351 | B2* | 8/2017 | Rong | ................... G02B 19/0028 |
| 9,863,622 | B1* | 1/2018 | Armer | ................. F21V 23/0414 |
| 2003/0063474 | A1 | 4/2003 | Coushaine | |
| 2004/0057252 | A1 | 3/2004 | Coushaine | |
| 2010/0254128 | A1 | 10/2010 | Pickard et al. | |
| 2012/0020083 | A1 | 1/2012 | Tucker et al. | |
| 2012/0140481 | A1 | 6/2012 | Simchak et al. | |
| 2012/0147624 | A1 | 6/2012 | Li et al. | |
| 2012/0175655 | A1 | 7/2012 | Cheng et al. | |
| 2012/0262932 | A1 | 10/2012 | Lu et al. | |
| 2013/0170221 | A1 | 7/2013 | Isogai et al. | |
| 2013/0200407 | A1 | 8/2013 | Roth | |
| 2014/0049957 | A1* | 2/2014 | Goelz | ................... F21V 29/763 362/235 |
| 2014/0119023 | A1* | 5/2014 | Chang | ................... F21V 29/505 362/294 |
| 2014/0175966 | A1 | 6/2014 | Tan | |
| 2014/0226317 | A1* | 8/2014 | Livesay | ................. F21V 29/70 362/147 |

FOREIGN PATENT DOCUMENTS

| | | |
|---|---|---|
| CN | 203215318 U | 9/2013 |
| DE | 102012201706 | 8/2012 |
| JP | 2000-315406 | 11/2000 |
| JP | 2003-176612 | 6/2003 |
| JP | 2006-113085 | 4/2006 |
| JP | 2006-202612 | 8/2006 |
| JP | 2007-317431 | 12/2007 |
| JP | 2011-243534 | 12/2011 |
| JP | 2012-9472 | 1/2012 |
| JP | 2012-28236 | 2/2012 |
| JP | 2012-146655 | 8/2012 |
| JP | 2012-523080 | 9/2012 |
| JP | 2013-525855 | 6/2013 |
| JP | 2013-533582 | 8/2013 |
| JP | 2013-239283 | 11/2013 |
| JP | 2013-543259 | 11/2013 |
| JP | 2014-170640 | 9/2014 |
| KR | 10-2014-0053520 A | 5/2014 |
| WO | WO 2012/049835 A1 | 4/2012 |
| WO | 2012/116478 | 9/2012 |
| WO | WO 2013/082859 A1 | 6/2013 |

OTHER PUBLICATIONS

International Search Report dated Aug. 25, 2016 in PCT/JP2015/064648, filed on May 21, 2015.

Extended Search Report dated Mar. 23, 2018 in European Patent Application No. 15860279.7.

Office Action as received in the corresponding European Patent Application No. 15 860 279.7 dated Apr. 26, 2019.

* cited by examiner

FIG. 12

SIMULATION EVALUATION RESULT

| | OPTICAL PATH A (%) | OPTICAL PATH B+C (%) | OPTICAL PATH D (%) | (B+C)/(A+B+C) (%) | DIAMETER OF LIGHT EMITTING FACE | LIGHT LEAK ANGLE (deg) | θ1 (deg) | θ2 (deg) | 1/2 BEAM ANGLE (deg) | UNEVENNESS OF ILLUMINATED SURFACE | LIGHT EMITTING EFFICIENCY |
|---|---|---|---|---|---|---|---|---|---|---|---|
| EXAMPLE 1 | 1 | 96 | 3 | 98.97 | 9 | 0.6 | 54.3 | 54.9 | 13 | NONE | 78 |
| EXAMPLE 2 | 6 | 89 | 5 | 93.68 | 14 | 2.8 | 50.3 | 53.2 | 20 | NONE | 77 |
| EXAMPLE 3 | 9 | 85 | 6 | 90.43 | 18 | 6.7 | 45 | 51.7 | 24 | NONE | 77 |
| EXAMPLE 4 | 0 | 94 | 6 | 100 | 9 | -6.9 | 61.8 | 54.9 | 14 | NONE | 75 |
| COMPARISON EXAMPLE 1 | 20 | 75 | 5 | 78.95 | 27 | 19.5 | 28.3 | 47.8 | 30 | EXIST | 76 |
| COMPARISON EXAMPLE 6 | 30 | 66 | 4 | 68.75 | 9 | — | — | — | 40 | — | — |

SPOT LIGHTING APPARATUS

CROSS-REFERENCE TO RELATED APPLICATION

This application is a continuation application of International Application PCT/JP2015/064648 filed on May 21, 2015 and designated the U.S., and this application is based upon and claims the benefit of priority of the prior Japanese Patent Application No. 2014-234629, filed on Nov. 19, 2014 and the prior Japanese Patent Application No. 2015-081735, filed on Apr. 13, 2015, the entire contents of which are incorporated herein by reference.

FIELD

The present invention relates to a spot lighting apparatus including a semiconductor light emitting device such as an LED (Light Emitting Diode).

BACKGROUND

Conventionally, a halogen bulb including filaments or a spot lighting apparatus using this halogen bulb has been widely used as general lighting equipment. However, along with needs for electric power saving, size reduction, and lengthened service life in recent years, an LED bulb or LED lamp using a light emitting element such as an LED as a light source, or a spot lighting apparatus using an LED have been developed and produced so that the LED bulb and the like have become popular. Moreover, glare prevention has been demanded for such an LED bulb or the like similarly for a general lighting equipment of related art, and there have been developed and investigated various structures concerning the glare prevention. For example, in order to decrease a glare caused by a direct light from the light source, Patent Document 1 discloses a lighting apparatus provided with a reflector on a light path of an LED, and Patent Document 2 discloses a lighting apparatus provided with a light blocking plate on a light path of an LED.

The lighting apparatus disclosed in Patent Document 1 includes a substantially tubular main reflector having a reflective surface, an LED light source provided to a bottom part of the main reflector, and a preliminary reflector reflecting lights emitted from the LED light source toward the main reflector. In the lighting apparatus of relevant Patent Document 1, an opening diameter of the main reflector is set to be relatively larger, and almost all of the lights emitted from the LED light source are directly emitted to the outside of the lighting apparatus without being reflected on the main reflector nor the preliminary reflector. In other words, the lighting apparatus of relevant Patent Document 1 uses a structure in which a beam angle of the light emitted from the lighting apparatus is made wide-angle.

The lighting apparatus disclosed in Patent Document 2 includes a bowl-shaped collimator having a bottom part and a side surface part, an LED light source provided to the bottom part in the collimator, a shielding plate provided on an optical axis of the LED light source to block lights emitted from the LED light source, and a light guide member arranged between the LED light source and the shielding plate. The lighting apparatus disclosed in this Patent Document 2 can make the beam angle of the light emitted from the lighting apparatus be relatively narrow-angle by reflecting almost all of the lights emitted from the LED light source on an inner wall in the collimator (reflective surface) to be emitted to the outside.

[Patent Document 1] U.S. Pat. No. 6,637,921
[Patent Document 2] U.S. Pat. No. 8,258,532

SUMMARY

In recent years, as a spot lighting apparatus using the LED has become widespread, the spot lighting apparatus has been demanded to be capable of illuminating an object to be illuminated in a more spotlight-like manner and more brightly illuminating the object to be illuminated while suppressing a glare light. However, the lighting apparatus disclosed in Patent Document 1 is insufficient in making the light be narrow-angle due to a configuration using the main reflector, the preliminary reflector, and the LED light source, and the lighting apparatus disclosed in Patent Document 2 is not able to improve a light emitting efficiency of the lighting apparatus due to a light loss which is generated since the shielding plate is provided on the light path of the LED light source.

Additionally, since the spot lighting apparatus using the LED is also demanded to be reduced in weight, it may be considered that the weight reduction can be dealt with by the size reduction or elimination of a heat sink. However, in the lighting apparatuses disclosed in Patent Documents 1 and 2, since a heat generated by the LED light source is radiated via a substrate, if the heat sink is reduced in size or eliminated, heat radiation is insufficient, so that a service life of the spot lighting apparatus is decreased. In other words, the mere size reduction of the heat sink or the like is not able to sufficiently attain the weight reduction and lengthened service life of the spot lighting apparatus.

Further, in place of a halogen bulb type spot lighting apparatus of related art which is installed on a ceiling, the use of the spot lighting apparatus using the LED has been increasingly demanded, but it is difficult to adequately meet requirements of the marketplace by merely replacing with the spot lighting apparatus using the existing LED. In a case where such a replace is carried out, an exchange aspect of the spot lighting apparatus, an optical property with respect to the object to be illuminated, and the lengthened service life of the spot lighting apparatus itself are matters of great interest. In other words, a spot lighting apparatus is to be demanded which is lengthened in its service life and by means of which many spot lighting apparatuses can be easily fixed to a higher position such as the ceiling, and a targeted object to be illuminated can be illuminated with a large luminous flux to perform an optimal optical presentation. However, many demands like these have not been taken up as problems to be simultaneously met, and there is no spot lighting apparatus dealing with such demands.

The present invention has been made in consideration of such problems, and has an object to provide a spot lighting apparatus which emits illuminating lights in a spotlight-like manner while aiming at the improvement of a light emitting efficiency of a lighting apparatus, and has a sufficient heat radiation property while aiming at the weight reduction.

In order to achieve the above object, a first aspect of the present invention is a spot lighting apparatus includes a bowl-shaped first reflection unit that has a bottom part, a side surface part, and an opening part facing the bottom part, a semiconductor light emitting device that is provided on the bottom part of the first reflection unit, a second reflection unit that is provided on an optical axis of the semiconductor light emitting device, and a fixing unit that fixes the second reflection unit to be separated from the semiconductor light emitting device, wherein the second reflection unit receives a part of a light released from the semiconductor light emitting device and reflects it toward the first reflection unit, the first reflection unit receives a part of a light released from the semiconductor light emitting device and all or a part of a light reflected on the second reflection unit and reflects them toward the opening part, and the light reflected on the first reflection unit and emitted from the opening part is 80% or more of total lights emitted from the opening part.

Here, in order to make be 80% or more of the total lights which are emitted from opening part, for example, there may be adjusted sizes of the first reflection unit and second reflection unit and an arrangement relationship between them, and angles between reflective surfaces included in them and the optical axis of the semiconductor light emitting device.

In the spot lighting apparatus according to the first aspect of the present invention, since a ratio of the light reflected on the first reflection unit and emitted from the opening part is increased, it is possible to emit a narrow-angle light in a more spotlight-like manner and decrease the light to be trapped in the first reflection unit or the light leaking from a lateral side of the first reflection unit to improve the light emitting efficiency.

In the spot lighting apparatus according to the first aspect of the present invention, since the semiconductor light emitting device is directly mounted on the bottom part of the first reflection unit, a heat generated by driving the semiconductor light emitting device is conducted along the first reflection unit and radiated from the first reflection unit without affecting other constituting members. This allows a heat radiation property of the spot lighting apparatus to be improved to prevent the semiconductor light emitting device and other constituting members from getting out of order and lengthen the service life of the spot lighting apparatus 1 itself.

Further, since the above constitution can achieve a sufficient heat radiation property without separately providing a heat sink, the heat sink which is relatively weighty is eliminated so that the weight reduction of the spot lighting apparatus itself is attained, and thus, the spot lighting apparatus can be easily and strongly installed even at the higher position such as a ceiling.

A second aspect of the present invention is that, in the above first aspect, a light emitting face of the semiconductor light emitting device, a reflective surface of the first reflection unit, and a reflective surface of the second reflection unit are substantially rotationally symmetric about the optical axis of the semiconductor light emitting device, and a light leak angle θt defined below is not less than −7.0° and not more than 10.0° and the light leak angle θt=θ1−θ2 (where, θ1 represents an angle between a first straight line and the optical axis of the semiconductor light emitting device, in a sectional view including the optical axis of the semiconductor light emitting device, the first straight line passing through a point at an outer circumference portion of the light emitting face of the semiconductor light emitting device and a point at an outer circumference portion of the first reflection unit, and θ2 represents an angle between a second straight line and the optical axis of the semiconductor light emitting device, in the sectional view including the optical axis of the semiconductor light emitting device, the second straight line passing through the point at the outer circumference portion of the light emitting face of the semiconductor light emitting device and a point at an outer circumference portion of the second reflection unit). By doing so, it is possible to emit a narrow-angle light in a more spotlight-like manner and eliminate unevenness of the illuminating light to perform an excellent spatial presentation.

A third aspect of the present invention is that, in the above first or second aspect, a ½ beam angle of the light emitted from the opening part is not less than 5° and not more than 25°. According to the third aspect, it is possible to emit a narrow-angle light in a more spotlight-like manner and eliminate unevenness of the illuminating light to perform an excellent spatial presentation.

A fourth aspect of the present invention is that, in the above first to third aspects, a luminous flux of the light emitted from the opening part per unit weight of the spot lighting apparatus is 3.0 lumen/g or more. According to the fourth aspect, plural problems can be simultaneously attained such as the easiness and certainty of installation, illumination with a large luminous flux in a spotlight-like manner, the optimal optical presentation, and the lengthened service life which have not been able to be achieved, exerting unprecedented effects. According to the fourth aspect, moreover, when installing on the ceiling or a column, a weight of the spot lighting apparatus itself is not to be a burden and the needed number of the spot lighting apparatuses can be stably installed. Further, according to the fourth aspect, since the emitted light is of a narrow angle, it is possible to illuminate an object to be illuminated with the illuminance needed even from a farther position and a higher position.

A fifth aspect of the present invention is that, in any one of the above first to fourth aspects, the light reflected in order first on the second reflection unit and next on the first reflection unit, and then, emitted from the opening part is 50% or more of the total lights emitted from the opening part. By doing so, it is possible to emit a narrow-angle light in a more spotlight-like manner and eliminate unevenness of the illuminating light to perform an excellent spatial presentation.

A sixth aspect of the present invention is that, in any one of the above first to fifth aspects, the light directly emitted from the opening part without being reflected on the first reflection unit nor the second reflection unit is 20% or less of the total lights emitted from the opening part. By doing so, it is possible to reduce the light directly emitted from the opening part that is an uncontrolled light, emit the narrow-angle light in a more spotlight-like manner, and perform the excellent spatial presentation.

A seventh aspect of the present invention is that, in any one of the above first to sixth aspects, within lights released from the semiconductor light emitting device, a ratio of lights trapped in the spot lighting apparatus without being emitted from the opening part is 10% or less. Here, as means for making the ratio of the lights trapped in the spot lighting apparatus be 10% or less, for example, the semiconductor light emitting device as a light source may be separated from the second reflection unit to make an angle between the reflective surface of the second reflection unit and the optical axis of the semiconductor light emitting device be an obtuse angle. By doing so, it is possible to efficiently emit the light released from the semiconductor light emitting device to an outside of the first reflection unit to improve the light emitting efficiency of the spot lighting apparatus itself.

An eighth aspect of the present invention is that, in any one of the above first to seventh aspects, the first reflection unit has a symmetry axis. By doing so, it is possible to emit the narrow-angle light in a more spotlight-like manner and perform the excellent spatial presentation, and as well improve an aesthetic appearance of the spot lighting apparatus itself.

A ninth aspect of the present invention is that, in the above eighth aspect, the semiconductor light emitting device is provided in a manner such that optical axis substantially matches the symmetry axis of the first reflection unit. By doing so, it is possible to emit the narrow-angle light in a more spotlight-like manner and perform the excellent spatial presentation, and as well improve an aesthetic appearance of the spot lighting apparatus itself.

A tenth aspect of the present invention is that, in any one of the above first to ninth aspects, the side surface part of the first reflection unit is formed substantially into a shape of a paraboloid of revolution. By doing so, it is possible to emit the narrow-angle light in a more spotlight-like manner and perform the excellent spatial presentation, and as well improve an aesthetic appearance of the spot lighting apparatus itself.

An eleventh aspect of the present invention is that, in any one of the above first to tenth aspects, the first reflection unit includes a heat radiation path that radiates a heat generated from the semiconductor light emitting device from the bottom part toward the side surface part. According to the constitution like this, it is possible to improve the heat radiation property of the spot lighting apparatus and attain improvement in the reliability and the lengthened service life.

A twelfth aspect of the present invention is that, in the above eleventh aspect, the first reflection unit is made from a material having a thermal conductivity of 30 W/(m·K) or more. According to the constitution like this, it is possible to further improve the heat radiation property of the spot lighting apparatus and easily attain the improvement in the reliability and the lengthened service life.

A thirteenth aspect of the present invention is that, in any one of the above first to twelfth aspects, the second reflection unit has a symmetry axis. By doing so, it is possible to emit the narrow-angle light in a more spotlight-like manner and perform the excellent spatial presentation, and as well improve an aesthetic appearance of the spot lighting apparatus itself.

A fourteenth aspect of the present invention is that, in the above thirteenth aspect, the semiconductor light emitting device is provided in a manner such that optical axis substantially matches the symmetry axis of the second reflection unit. By doing so, it is possible to emit the narrow-angle light in a more spotlight-like manner and perform the excellent spatial presentation, and as well improve an aesthetic appearance of the spot lighting apparatus itself.

A fifteenth aspect of the present invention is that, in any one of the above first to thirteenth aspects, the reflective surface of the second reflection unit is inclined with respect to the optical axis of the semiconductor light emitting device, and an angle formed between the reflective surface of the second reflection unit and the optical axis of the semiconductor light emitting device is an obtuse angle. By doing so, it is possible to emit the narrow-angle light in a more spotlight-like manner to perform an excellent spatial presentation.

A sixteenth aspect of the present invention is that, in any one of the above first to fifteenth aspects, the fixing unit couple the bottom part of the first reflection unit with the second reflection unit at a portion surrounding a mounted area the semiconductor light emitting device. According to the constitution like this, it is possible to prevent piece-to-piece variations of a product in a manufacturing process of the spot lighting apparatus, that is, prevent a distance between the semiconductor light emitting device and the second reflection unit from being different from product to product. Moreover, according to the constitution like this, it is possible to prevent fluctuation of the distance between the semiconductor light emitting device and the second reflection unit caused by a physical or thermal shock. Further, according to the constitution like this, a luminous intensity distribution property of the emitted light is made constant, well illuminating with the more stable light.

A seventeenth aspect of the present invention is that, in any one of the above first to fifteenth aspects, the fixing unit couples the side surface part of the first reflection unit with the second reflection unit. Even in a case where there is no space for the fixing unit at the bottom part of the first reflection unit, the second reflection unit can be strongly coupled to improve the reliability of the spot lighting apparatus.

Moreover, in order to achieve the above object, a eighteenth aspect of the present invention is a spot lighting apparatus includes a bowl-shaped first reflection unit that has a bottom part, a side surface part, and an opening part facing the bottom part, a semiconductor light emitting device that is provided on the bottom part of the first reflection unit, a second reflection unit that is provided on an optical axis of the semiconductor light emitting device, and a fixing unit that fixes the second reflection unit to be separated from the semiconductor light emitting device, in which the second reflection unit receives a part of a light released from the semiconductor light emitting device and reflects it toward the first reflection unit, the first reflection unit receives a part of a light released from the semiconductor light emitting device and all or a part of a light reflected on the second reflection unit and reflects them toward the opening part, a light emitting face of the semiconductor light emitting device, a reflective surface of the first reflection unit, and a reflective surface of the second reflection unit are substantially rotationally symmetric about the optical axis of the semiconductor light emitting device, and a light leak angle θt defined below is not less than −7.0° and not more than 10.0° and the light leak angle θt=θ1−θ2 (where, θ1 represents an angle between a first straight line and the optical axis of the semiconductor light emitting device, in a sectional view including the optical axis of the semiconductor light emitting device, the first straight line passing through a point at an outer circumference portion of the light emitting face of the semiconductor light emitting device and a point at an outer circumference portion of the first reflection unit, and θ2 represents an angle between a second straight line and the optical axis of the semiconductor light emitting device, in the sectional view including the optical axis of the semiconductor light emitting device, the second straight line passing through the point at the outer circumference portion of the light emitting face of the semiconductor light emitting device and a point at an outer circumference portion of the second reflection unit).

In the spot lighting apparatus according to the eighteenth aspect of the present invention, since a ratio of the light reflected on the first reflection unit and emitted from the opening part is increased, it is possible to emit a narrow-angle light in a more spotlight-like manner and decrease the light to be trapped in the first reflection unit or the light leaking from a lateral side of the first reflection unit to improve the light emitting efficiency.

In the spot lighting apparatus according to the eighteenth aspect of the present invention, since the semiconductor light emitting device is directly mounted on the bottom part of the first reflection unit, a heat generated by driving the semiconductor light emitting device is conducted along the first reflection unit and radiated from the first reflection unit without affecting other constituting members. This allows the heat radiation property of the spot lighting apparatus to be improved to prevent the semiconductor light emitting device and other constituting members from getting out of order and lengthen the service life of the spot lighting apparatus 1 itself.

Further, since, in the spot lighting apparatus according to the eighteenth aspect, the above constitution can achieve a sufficient heat radiation property without separately providing a heat sink, the heat sink which is relatively weighty is eliminated so that the weight reduction of the spot lighting apparatus itself is attained, and thus, the spot lighting apparatus can be easily and strongly installed even at the higher position such as a ceiling.

The nineteenth aspect of the present invention is that, in the above eighteenth aspect, the θ1 is not less than 40.0° and not more than 70.0°. By doing so, it is possible to emit a narrow-angle light in a more spotlight-like manner and eliminate unevenness of the illuminating light to perform an excellent spatial presentation.

A twentieth aspect of the present invention is that, in the above eighteenth or nineteenth aspect, the θ2 is not less than 45.0° and not more than 60.0°. By doing so, it is possible to emit a narrow-angle light in a more spotlight-like manner and eliminate unevenness of the illuminating light to perform an excellent spatial presentation.

A twenty-first aspect of the present invention is that, in any one of the above eighteenth to twentieth aspect, a ½ beam angle of the light emitted from the opening part is not less than 5° and not more than 25°. By doing so, it is possible to emit a narrow-angle light in a more spotlight-like manner and eliminate unevenness of the illuminating light to perform an excellent spatial presentation.

A twenty-second aspect of the present invention is that, in any one of the above eighteenth to twenty-first aspects, a luminous flux of the light emitted from the opening part per unit weight of the spot lighting apparatus is 3.0 lumen/g or more. By doing so, plural problems can be simultaneously attained such as the easiness and certainty of installation, illumination with a large luminous flux in a spotlight-like manner, the optimal optical presentation, and the lengthened service life which have not been able to be achieved, exerting unprecedented effects. Moreover, when installing on the ceiling or a column, a weight of the spot lighting apparatus itself is not to be a burden and the needed number of the spot lighting apparatuses can be stably installed. Further, since the emitted light is of a narrow angle, it is possible to illuminate an object to be illuminated with the illuminance needed even from a farther position and a higher position.

A twenty-third aspect of the present invention is that, in any one of the above eighteenth to twenty-second aspects, the side surface part of the first reflection unit is formed substantially into a shape of a paraboloid of revolution. By doing so, it is possible to emit the narrow-angle light in a more spotlight-like manner and perform the excellent spatial presentation, and as well improve an aesthetic appearance of the spot lighting apparatus itself.

A twenty-fourth aspect of the present invention is that, in any one of the above eighteenth to twenty-third aspects, the first reflection unit includes a thermal conductive path that radiates a heat generated from the semiconductor light emitting device from the bottom part toward the side surface part. According to the constitution like this, it is possible to improve the heat radiation property of the spot lighting apparatus and attain improvement in the reliability and the lengthened service life.

A twenty-fifth aspect of the present invention is that, in the above twenty-fourth aspect, the first reflection unit is made from a material having a thermal conductivity of 30 W/(m·K) or more. According to the constitution like this, it is possible to further improve the heat radiation property of the spot lighting apparatus and easily attain the improvement in the reliability and the lengthened service life.

A twenty-sixth aspect of the present invention is that, in any one of the above eighteenth to twenty-fifth aspects, the second reflection unit has a symmetry axis. By doing so, it is possible to emit the narrow-angle light in a more spotlight-like manner and perform the excellent spatial presentation, and as well improve an aesthetic appearance of the spot lighting apparatus itself.

A twenty-seventh aspect of the present invention is that, in the above twenty-sixth aspect, the semiconductor light emitting device is provided in a manner such that optical axis substantially matches the symmetry axis of the second reflection unit. By doing so, it is possible to emit the narrow-angle light in a more spotlight-like manner and perform the excellent spatial presentation, and as well improve an aesthetic appearance of the spot lighting apparatus itself.

A twenty-eighth aspect of the present invention is that, in any one of the above eighteenth to twenty-seventh aspects, the reflective surface of the second reflection unit is inclined with respect to the optical axis of the semiconductor light emitting device, and an angle formed between the reflective surface of the second reflection unit and the optical axis of the semiconductor light emitting device is an obtuse angle. By doing so, it is possible to emit the narrow-angle light in a more spotlight-like manner to perform an excellent spatial presentation.

A twenty-ninth aspect of the present invention is that, in any one of the above eighteenth to twenty-eighth aspects, the fixing unit couples the side surface part of the first reflection unit with the second reflection unit. Even in a case where there is no space for the fixing unit at the bottom part of the first reflection unit, the second reflection unit can be strongly fixed to improve the reliability of the spot lighting apparatus.

Further, in order to achieve the above object, a thirtieth aspect of the present invention is a spot lighting apparatus includes a semiconductor light emitting device, and a reflection structure that mounts the semiconductor light emitting device on a bottom part, and reflects at least a part of the light emitted from the semiconductor light emitting device and emits the light from an opening part that is positioned on an opposite side of the bottom part, in which a ½ beam angle of the light emitted from the opening part is not less than 5° and not more than 30°, and a luminous flux of the light emitted from the opening part per unit weight of the spot lighting apparatus is 3.0 lumen/q or more.

Here, a preferable value of a numerical value of the luminous flux is varied depending on a shape of a base included in the semiconductor light emitting device, but is preferably is 4.0 lumen/g or more, and further preferably 5.0 lumen/g or more.

In the spot lighting apparatus according to the thirtieth aspect, based on the above described constitution and setting, plural problems can be simultaneously attained such as the easiness and certainty of installation, illumination with a large luminous flux in a spotlight-like manner, the optimal optical presentation, and the lengthened service life which have not been able to be achieved, exerting unprecedented effects. Moreover, when installing on the ceiling or a column, a weight of the spot lighting apparatus itself is not to be a burden and the needed number of the spot lighting apparatuses can be stably installed. Further, since the emitted light is of a narrow angle, it is possible to illuminate an object to be illuminated with the illuminance needed even from a farther position and a higher position.

A thirty-first aspect of the present invention is that, in the above thirtieth aspect, the reflection structure reflects at least a part of the light emitted from the semiconductor light emitting device two times to be emitted from the opening part. By doing so, it is possible to emit the narrow-angle light in a more spotlight-like manner and perform the excellent spatial presentation, and as well improve the light emitting efficiency of the spot lighting apparatus itself.

A thirty-second aspect of the present invention is that, in the above thirtieth or thirty-first aspect, the reflection structure directly radiates a heat generated from the semiconductor light emitting device. According to the constitution like this, it is possible to improve the heat radiation property of the spot lighting apparatus and attain improvement in the reliability and the lengthened service life.

A thirty-third aspect of the present invention is that, in any one of the above thirtieth or thirty-second aspect, the reflection structure suppresses fluctuation of a distance between the semiconductor light emitting device and a reflective surface of the reflection structure caused by a physical or thermal shock. By doing so, a luminous intensity distribution property of the emitted light is made constant, well illuminating with the more stable light.

As described above, according to the present invention, it is possible to provide the spot lighting apparatus which emits the illuminating lights in a spotlight-like manner while aiming at the improvement of the light emitting efficiency, and has a sufficient heat radiation property while aiming at the weight reduction.

BRIEF DESCRIPTION OF DRAWINGS

FIG. 12 is a table representing simulation evaluation results of Examples and Comparison examples;

DESCRIPTION OF EMBODIMENTS

Hereinafter, a description is given of an embodiment of the present invention based on the drawings. Note that the present invention is not limited to content described below, and may be arbitrarily changed and carried out in a scope not changing a gist thereof. In addition, any drawing used for describing the embodiments schematically illustrates a spot lighting apparatus, structure members thereof and the like according to the present invention, and has portions partially emphasized, enlarged, diminished, or omitted for deeply understanding and does not necessarily represent scales or shapes of the spot lighting apparatus, the structure members thereof, and the like in some cases. Further, any of various numerical values and numerical quantities used in the embodiment represents an example and may be adequately changed as needed.

Embodiment

Figure 1:
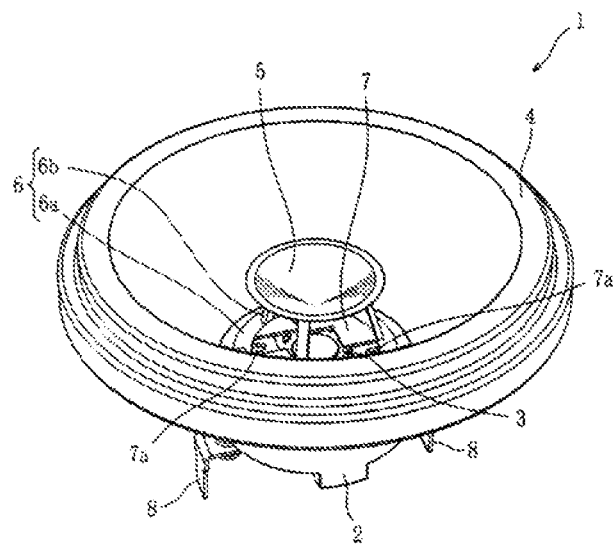
FIG. 1 is a perspective view of a spot lighting apparatus according to an embodiment.
Figure 2:
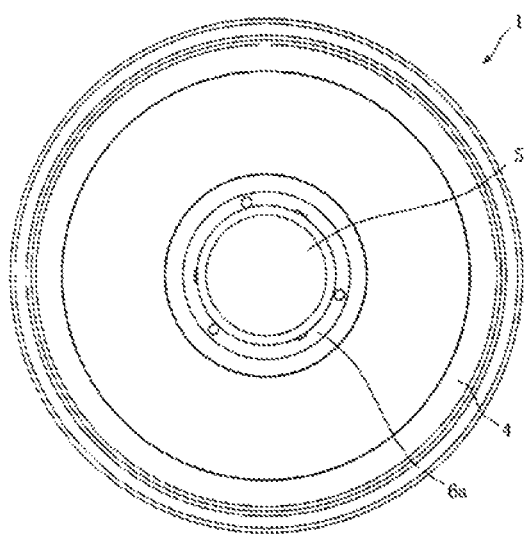
FIG. 2 is a top view of the spot lighting apparatus according to the embodiment.
Figure 3:
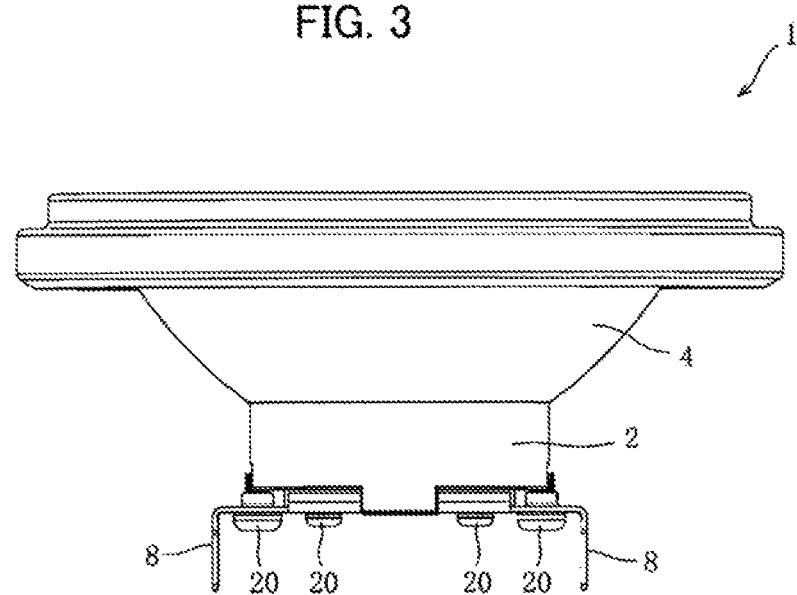
FIG. 3 is a lateral view of the spot lighting apparatus according to the embodiment.
Figure 4:
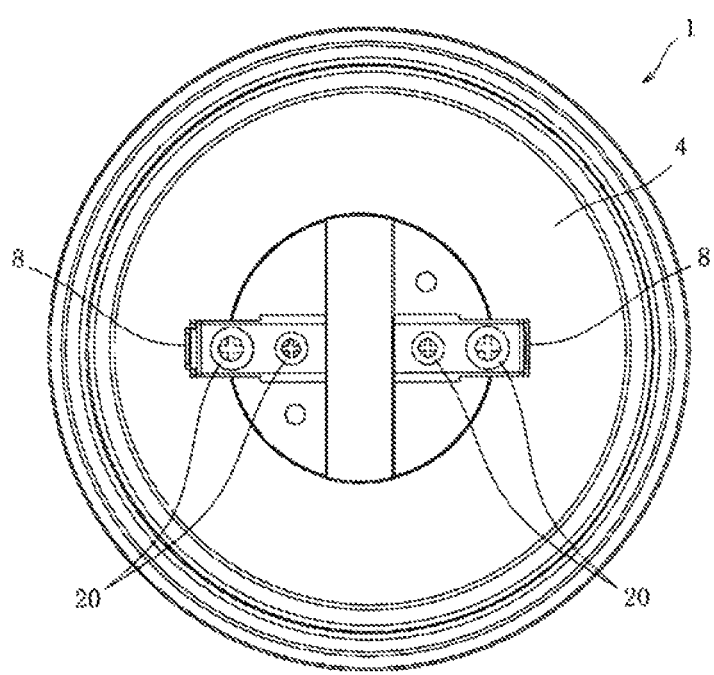
FIG. 4 is a bottom plan view of the spot lighting apparatus according to the embodiment.
Figure 5:
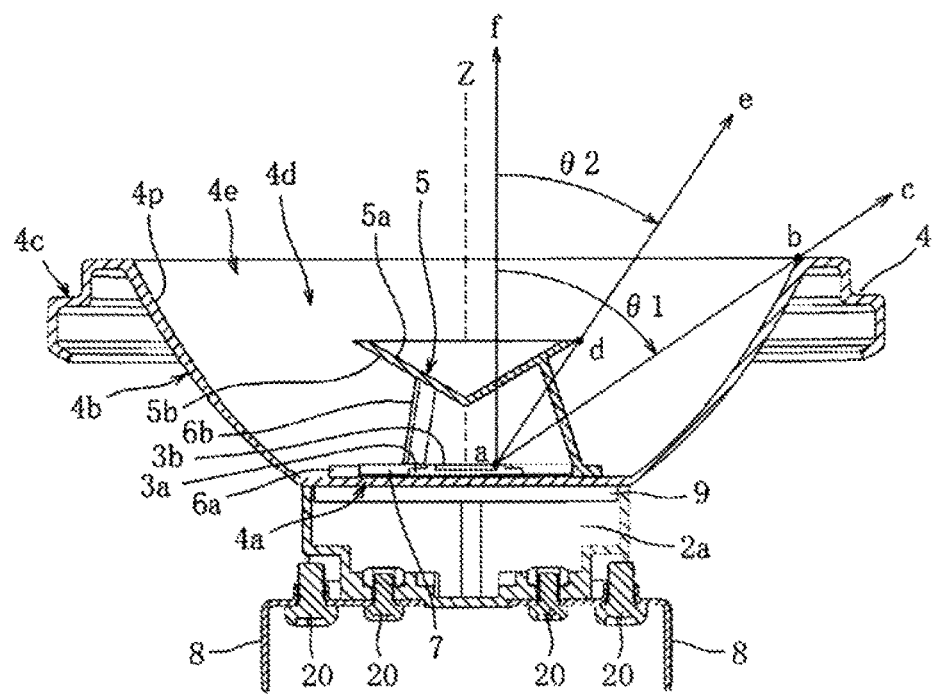
FIG. 5 is a sectional view of the spot lighting apparatus taken along a line V-V in FIG. 2.
Figure 6:
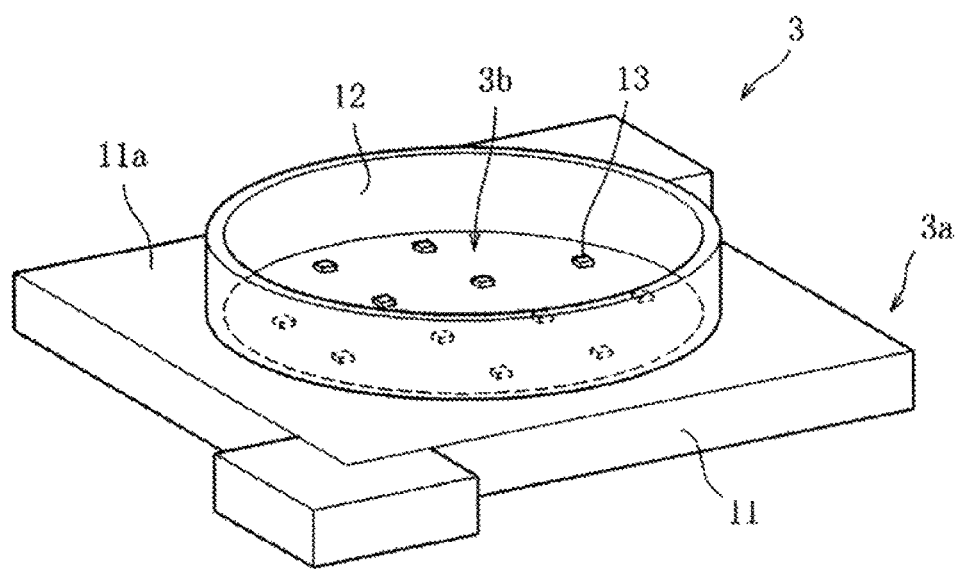
FIG. 6 is a perspective view of a light emitting module constituting the spot lighting apparatus according to the embodiment.
Figure 7:
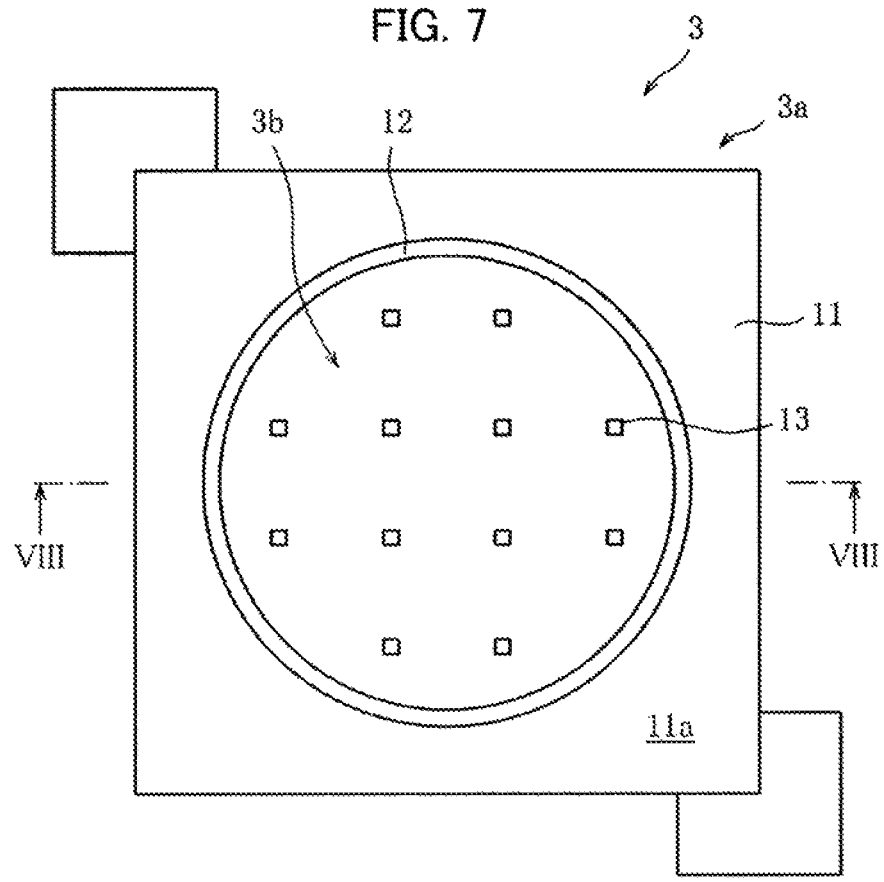
FIG. 7 is a top view of the light emitting module constituting the spot lighting apparatus according to the embodiment.
Figure 8:
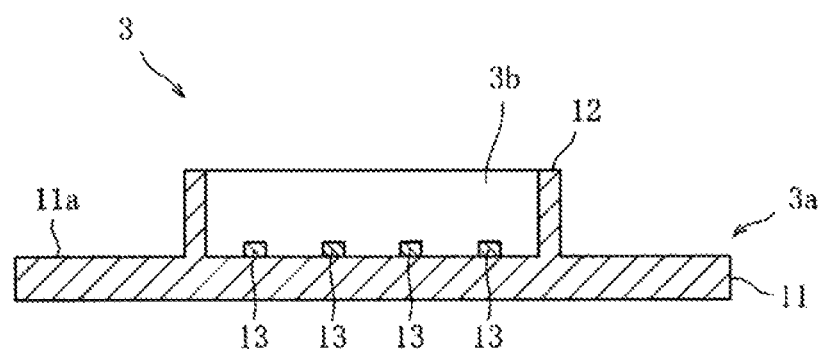
FIG. 8 is a sectional view of the light emitting module taken along a line VIII-VIII in FIG. 7.
Figure 9:
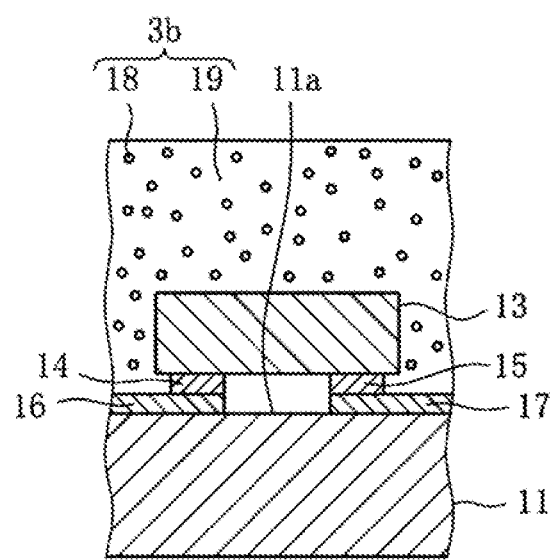
FIG. 9 is a main part enlarged view of the sectional view illustrated in FIG. 8.

Hereinafter, a description is given of a spot lighting apparatus and constituting members thereof according to the embodiment of the present invention with reference to FIG. 1 to FIG. 9. FIG. 1 is a perspective view of a spot lighting apparatus according to the embodiment, FIG. 2 is a top view of the spot lighting apparatus according to the embodiment, FIG. 3 is a lateral view of the spot lighting apparatus according to the embodiment, FIG. 4 is a bottom plan view of the spot lighting apparatus according to the embodiment, and FIG. 5 is a sectional view of the spot lighting apparatus taken along a line V-V in FIG. 2. Additionally, FIG. 6 is a perspective view of a light emitting module constituting the spot lighting apparatus according to the embodiment, FIG. 7 is a top view of the light emitting module constituting the spot lighting apparatus according to the embodiment, FIG. 8 is a sectional view of the light emitting module taken along a line VIII-VII in FIG. 7, and FIG. 9 is a main part enlarged view of the sectional view illustrated in FIG. 8.

Constitution of Spot Lighting Apparatus

As is seen from FIG. 1 to FIG. 5, a spot lighting apparatus 1 according to the embodiment is constituted by a driver housing 2, a light emitting module (semiconductor light emitting device) 3 that serves as a light source, a substantially bowl-shaped first reflection unit 4 that the light emitting module 3 is mounted, a second reflection unit 5 that is provided in the first reflection unit 4 on an optical axis of the light emitting module 3, a fixing unit 6 that fixes the second reflection unit 5 to be separated from the light emitting module 3, a positioning member 7 that positions the light emitting module 3 with respect to the first reflection unit 4, and a base 8 coupled with the driver housing 2. Moreover, in the embodiment, the first reflection unit 4 and the second reflection unit 5 constitute a reflection structure for reflecting at least a part of light outgoing from the light emitting module 3 to the outside of the spot lighting apparatus 1 to be emitted.

In the spot lighting apparatus 1 according to the embodiment, when electric power externally supplied is fed via the base 8 to the light emitting module 3, the light emitting module 3 is driven to make the light go out, and the outgoing light is, basically, reflected merely one time by the first reflection unit 4 to be emitted to the outside, or reflected onto the second reflection unit 5 and thereafter reflected by the first reflection unit 4 (two times in total) to be emitted to the outside, and further, in some cases, directly emitted to the outside without being reflected on the first reflection unit 4 nor the second reflection unit 5 depending on an arrangement relationship between the first reflection unit 4 and the second reflection unit 5 or the like. Then, according to the constitution described above, the spot lighting apparatus 1 according to the embodiment can serve as an AR111 type lighting apparatus.

(Driver Housing)

The driver housing 2 of the spot lighting apparatus 1 has a substantially columnar outer shape as is seen from FIG. 3 and FIG. 5, and has a cavity 2a formed therein for incorporating various parts. Here, examples of the various parts include a circuit substrate 9 including a driver circuit for lighting the light emitting module 3 as illustrated in FIG. 5. The driver housing 2 is formed of a relatively robust material which is not broken or the like by an external force. Further, it is preferable to use a material relatively low in its heat conduction as the material for the driver housing 2. This is for the purpose of suppressing a heat generated in the light emitting module 3 being conducted to a driver housing 2 side to prevent the parts provided in the driver housing 2 from getting out of order. Examples of the driver housing 2 include a resin, a ceramic, a metal, and the like, for example, and the resin is preferable such as polybutylene terephthalate, polyethylene terephthalate, polycarbonate, polyethylene, polypropylene, ABS resin, phenol resin, epoxy resin, silicone resin, nylon and the like, particularly in view of the heat radiation property, heat conduction, durability, and the like.

Note that the shape of the driver housing 2 is not limited to those described above, and may be adequately changed depending on various conditions such as an environment that the spot lighting apparatus 1 is to be installed, and dimensions and numerical quantities of the incorporated parts. For example, the outer shape of the driver housing 2 may be substantially rectangular columnar or substantially frustum-shaped.

(Light Emitting Module)

As illustrated in FIG. 5, the light emitting module 3 is mounted on a center portion of a bottom part 4a of the first reflection unit 4. The light emitting module 3 has a module main body 3a and a wavelength converting member 3b contained in the module main body 3a. The module main body 3a is provided for protecting the wavelength converting member 3b against a shock externally applied or the like, and a material used for the module main body 3a includes those relatively hard such as a metal (e.g., iron, aluminum, copper, and ceramic). Further, in the embodiment, the module main body 3a is fixed on the bottom part 4a of the first reflection unit 4 by the positioning member 7, but may be fixed on the bottom part 4a by use of a joining member such as a screw or an adhesive material. For the adhesive, it is preferable to use a heat radiation adhesive. Moreover, the module main body 3a is provided with a circular opening for making the light go out, and, for example, a light that whitening is completed inside the body 3a can be taken out from this opening. The constitution of the light emitting module 3 like this allows, in the embodiment, a light emitting face of the light emitting module 3 to be substantially rotationally symmetric about the optical axis of the light emitting module 3.

On the other hand, in another case, it is also possible that a glass plate or the like is provided to this opening, phosphor is applied on the glass face on an inner side of the module, and this portion is used to carrying out whitening to take out the light. Note that this opening is not limited to be circular-shaped, and may be shaped into a polygon such as a rectangle or other shapes. In other words, the shape of the opening may be adequately changed to conform to a desired shape of a light outgoing face of the light emitting module 3.

As is seen from FIG. 6 to FIG. 8, the module main body 3a is constituted by a flat plate unit 11 that serves as a wiring substrate, and a side wall unit 12 that is located on a chip mounting surface 11a of the flat plate unit 11 and has a cylindrical shape. Additionally, as is seen from FIG. 6 and FIG. 7, twelve LED chips 13 as semiconductor light emitting elements are regularly arrayed on the chip mounting surface 11a of the flat plate unit 11 on an inner side of the side wall unit 12. Specifically, four LED chips 13 are arranged at a center portion of the flat plate unit 11 at an equal interval, and eight LED chips 13 are arranged in a manner to surround four direction sides of the relevant four LED chips 13. The respective four LED chips 13 arranged at the center portion are arranged at positions at equal distances from the center of the flat plate unit 11, and similarly, the respective eight LED chips 13 arranged in a manner to surround the four direction sides of these four chips are arranged at positions at equal distances from the center of the flat plate unit 11. In other words, the relevant four LED chips 13 and the relevant eight LED chips are respectively concentrically arranged so that twelve LED chips 13 totally define a substantially circular LED chip mounting area. Note that although not illustrated in FIG. 6 to FIG. 8, the flat plate unit 11 has a wiring pattern formed thereon for supplying the electric power to each of these LED chips 13.

In the embodiment, an LED chip that emits a blue light having a peak wavelength of 450 nm is used for the LED chip 13. Specifically, as an LED chip like this, for example, there is a GaN-based LED chip that an InGaN semiconductor is used for a light emitting layer. Note that a kind or emission wavelength characteristic of the LED chip 13 is not limited to this, and various semiconductor light emitting elements such as the LED chip can be used unless otherwise departed from the gist of the present invention. In the embodiment, the peak wavelength of the light emitted from the LED chip 13 is preferably within a wavelength range of 380 nm to 480 nm, and more preferably within a wavelength range of 440 nm to 470 nm.

Note that a material of the module main body 3a is not limited to those described above, and, for example, a material may be used that is selected from resin, glass epoxy, composite resin containing a filler in resin and the like which are materials excellent in electrical insulation. Alternatively, in terms of enhancing light reflectiveness in the chip mounting surface 11a of the flat plate unit 11 to improve the light emitting efficiency of the wavelength converting member 3b, it is preferable to use silicone resin containing a white pigment such as an alumina powder, a silica powder, a magnesium oxide, and titanium oxide. In order to obtain the more excellent heat radiation property, the module main body 3a may be constituted by a metal such as aluminum, and an interlayer dielectric film of resin or the like may be formed on this metal such as aluminum to electrically insulate the wiring pattern of the flat plate unit 11 and the like from a metallic main body.

As illustrated in FIG. 9, a p-electrode 14 and an n-electrode 15 are provided on a surface of the LED chip 13 facing the flat plate unit 11 side. In the LED chip 13, the p-electrode 14 is joined to a wiring pattern 16 formed on the chip mounting surface 11a of the flat plate unit 11, and similarly, the n-electrode 15 is joined to a wiring pattern 17 formed on the chip mounting surface 11a. Couplings of these p-electrode 14 and n-electrode 15 with the wiring pattern 16 and the wiring pattern 17 are made via a metal bump not illustrated or by soldering. Each of other LED chips 13 not illustrated also has the p-electrode 14 and the n-electrode 15 similarly joined to the wiring pattern 16 and the wiring pattern 17, respectively, which are formed on the chip mounting surface 11a of the flat plate unit 11 correspondingly to the respective LED chips 13.

Note that the method of mounting the LED chip 13 to the flat plate unit 11 is not limited to this, and a proper method may be selected depending on the kind or structure of the LED chip 13. For example, after the LED chip 13 is adhered and fixed to a predetermined position on the flat plate unit 11, two electrodes of each LED chip 13 may be coupled with the corresponding wiring patterns by means of wire bonding, or one electrode may be joined to the corresponding wiring pattern as described above and the other electrode may be coupled with the corresponding wiring pattern by means of wire bonding.

As is seen from FIG. 6 to FIG. 8, an inner area surrounded by the side wall unit 12 is provided with the wavelength converting member 3b that wavelength-converts the blue light outgoing from the LED chip 13. In the light emitting module 3 according to the embodiment, the blue light emitted from the LED chip 13 and an outgoing light which is obtained by wavelength-converting the blue light by the wavelength converting member 3b are synthesized, and the synthesized light is made to go out from the opening of the module main body 3a. Note that a glass plate or the like may be provided to an opening of a container case for the module, the wavelength converting member 3b is applied on the glass face on an inner side of the module, and this portion is used to carrying out whitening to take out the light.

As illustrated in FIG. 9, the wavelength converting member 3b absorbs at least a part of the blue light incident from the LED chip 13, and is constituted by a phosphor 18 that releases an outgoing light having a wavelength different from the blue light and a base material 19 that holds the phosphor 18. In the wavelength converting member 3b according to the embodiment, since the LED chip 13 emitting the blue light is used as the semiconductor light emitting element, a part of the blue light can be wavelength-converted into a yellow light to synthesize the white light. Therefore, for the phosphor 18 in the embodiment, a yellow phosphor is used which is excited by absorbing the blue light and emits a light having a wavelength different from the blue light in returning from a ground state.

A specific emission peak wavelength of the yellow phosphor is preferably within a wavelength range of ordinarily 530 nm or more, preferably 540 nm or more, and more preferably 550 nm or more, and ordinarily 620 nm or less, preferably 600 nm or less, and more preferably 580 nm or less. Among them, as the yellow phosphor, preferable are, for example, $Y_3Al_5O_{12}$:Ce [YAG phosphor], $(Y,Gd)_3Al_5O_{12}$:Ce, $(Sr,Ca,Ba,Mg)_2SiO_4$:Eu, $(Ca,Sr)Si_2N_2O_2$:Eu, α-sialon, $La_3Si_6N_{11}$:Ce (however, a part of which may be substituted by Ca or O).

For the base material 19, a material having translucency such as resin or glass may be used, and the resin is used in the embodiment. In the embodiment, the wavelength converting member 3b is formed by kneading the phosphor 18 into the base material 19 that is the resin.

Examples of the specific resin to be used preferably include polycarbonate resin, polyester-based resin (e.g., polyethylene terephthalate resin, polybutylene terephthalate resin), acrylic-based resin (e.g., polymethylmethacrylate resin), polyurethane resin, epoxy resin, and silicone-based resin. Moreover, it is preferable that the resin does not absorb the light released from the LED chip (e.g., ultraviolet light, near-ultraviolet light, blue light, or the like), or a visible light released from the wavelength converting member. Further, it is preferable that the resin has a sufficient transparency and durability with respect to the blue light emitted from the LED chip 13.

These resins may be used as one kind alone, or as two or more kinds in combination. Moreover, a copolymer of these resins may be used, or two or more kinds may be laminated to be used.

Note that as a resin, the polycarbonate resin can be most preferably used because of being excellent in transparency, heat resistance, mechanical property, and flame retardancy.

The light outgoing from the light emitting module 3 is also not limited to the white light, and a colored light such as a blue light, a red light, and a yellow light may be made to go out.

Further, in the embodiment, the light emitting module 3 of a chip on board (COB: Chip On Board) type provided with a plurality of LED chips 13 is fixed as the semiconductor light emitting device to the first reflection unit 4, but the semiconductor light emitting device is not limited to the COB such as those described above. For example, an LED package device of such a package type that the LED chip is embedded in the wavelength converting member may be used as the semiconductor light emitting device. Alternatively, a semiconductor light emitting device may be used which has a structure that the wavelength converting member is arranged on the bottom part 4a of the first reflection unit 4, and the LED chip is located on the wavelength converting member. In a case like this, the LED chip and the wavelength converting member are not limited to those described above, and any well-known may be variously used.

As a light source of the spot lighting apparatus 1, a semiconductor light emitting device may be used which includes a semiconductor laser and a wavelength converting member that wavelength-converts at least a part of a laser light of the semiconductor laser. In a case like this, for example, the wavelength converting member may be arranged on the bottom part 4a of the first reflection unit 4 to arrange the semiconductor laser in a housing space which is defined by the bottom part 4a protruding toward the driver housing 2 side.

(First Reflection Unit)

As is seen from FIG. 1 to FIG. 5, the first reflection unit 4 includes the bottom part 4a, the side surface part 4b, and an edge part 4c, and the outer shape thereof is substantially bowl-shaped. Here, the first reflection unit 4 has a symmetry axis. The side surface part 4b is formed to be axially symmetric about the symmetry axis and is formed substantially into a shape of a paraboloid of revolution. Further, the symmetry axis of the first reflection unit 4 matches an optical axis Z of the light emitting module 3. In other words, the light emitting module 3 is arrange in a manner such that the optical axis Z of the light emitting module 3 substantially matches the symmetry axis of the first reflection unit 4, and the side surface part 4b serving as a reflective surface of the first reflection unit 4 is substantially rotationally symmetric about the optical axis of the light emitting module 3.

In addition, the first reflection unit 4 has a cavity 4d defined therein that the light emitting module 3 and the second reflection unit 5 can be located, and further has an opening part 4e formed therein that the light outgoing from the light emitting module 3 is emitted to the outside of the spot lighting apparatus 1. Here, the opening part 4e faces the bottom part 4a. In other words, the first reflection unit 4 is formed so as to surround the light emitting module 3 and the second reflection unit 5 by the bottom part 4a and the side surface part 4b, and has a structure that the light emitting module 3 and the second reflection unit 5 can be visibly seen via the opening part 4e. For example, an opening diameter of the opening part 4e is 103 mm.

Further, the first reflection unit 4 has the circuit substrate 9 mounted and the driver housing 2 fixed on a face of the bottom part 4a on an opposite side of a face on which the light emitting module 3 is mounted. The edge part 4c of the first reflection unit 4 has a shape folded toward the side surface part 4b. The shape of the edge part 4c like this allows the spot lighting apparatus 1 to be hooked on an attachment mechanism part of the lighting apparatus placed at an installation location such as the ceiling so that the spot lighting apparatus 1 is strongly fixed to the ceiling or the like.

In the embodiment, for the first reflection unit 4, a material having a thermal conductivity of 30 W/(m·K) or more is selected. For example, the first reflection unit 4 may be constituted by preferably metal, and more preferably aluminum or aluminum alloy. Since the first reflection unit 4 is constituted by such materials, the first reflection unit 4 is to have a thermal conductive path for radiating the heat generated from the light emitting module 3 from the bottom part 4a toward the side surface part 4b. Then, the defined relevant thermal conductive path allows the heat generated from the light emitting module 3 to be well radiated to the outside, which makes it possible to protect the light emitting module 3 and the circuit substrate 9 in the driver housing 2 or the like against this heat and attain the lengthened service life of the spot lighting apparatus 1.

In addition, in the embodiment, an inner side surface 4f of the side surface part 4b of the first reflection unit 4 is subjected to desired surface processing so that the inner side surface 4f serves as a reflective surface capable of reflecting the light outgoing from the light emitting module 3. The surface processing can be selected from various surfaces finishing such as mirror finishing, diamond cutting, embossing, or faceting, for example.

The constitution of the first reflection unit 4 like this allows the first reflection unit 4 to receive and reflect toward the opening part 4e a part of the light released from light emitting module 3 and all or a part of the light reflected on the second reflection unit 5.

Note that in the embodiment, the first reflection unit 4 is formed of one material into one form, but the bottom part 4a, the side surface part 4b, and the edge part 4c may be formed of different materials and coupled with each other using an adhesive or the like to form the first reflection unit 4. In a case like this, depending on a condition such as a requirements specification of the spot lighting apparatus 1, the thermal conductivities of materials constituting the bottom part 4a, the side surface part 4b, and the edge part 4c may be adequately changed, and an optimal aspect (weight reduction or heat radiation property improvement) and cost reduction for the spot lighting apparatus 1 may be further attained.

The shape of the side surface part 4b of the first reflection unit 4 is not limited to the shape described above, and may be adequately changed so long as the optical property demanded for the spot lighting apparatus 1 can be met. In other words, the shape of the side surface part 4b of the first reflection unit 4 can be adequately changed to conform to a demanded luminous intensity distribution shape. More specifically, it is possible to adequately change a curvature of a curved surface of the paraboloid on the side surface part 4b of the first reflection unit 4, or the side surface part 4b may be flat without being curved.

Further, the bottom part 4a of the first reflection unit 4 corresponding to a portion surrounding a mounted area for the light emitting module 3 (i.e., an edge portion of the bottom part 4a) may be lowered to the driver housing 2 side with respect to the bottom part 4a of the first reflection unit 4 corresponding to the mounted area of the light emitting module 3 (i.e., the center portion of the bottom part 4a). In other words, an area on the bottom part 4a that the light emitting module 3 is mounted may be protruded to the opening part 4e side so as to concave an area that the light emitting module 3 is not mounted. For example, the bottom part 4a may be curved so as to protrude the center portion thereof, or a step may be provided so as to protrude the center portion. Such an adjustment of the bottom part 4a shape can prevent deterioration of the luminous intensity distribution of the spot lighting apparatus 1 which is caused by light reflection on the portion surrounding the mounted area of the light emitting module 3 (specifically, prevent the beam angle from increasing owing to the light caused by this refection appearing at a rim of the luminous intensity distribution).

(Second Reflection Unit)

As is seen from FIG. 1, FIG. 2, and FIG. 5, the second reflection unit 5 has a shape that an outer shape thereof is conical and a cavity 5a is defined in an inner side thereof (so-called hollow conical shape). Here, the second reflection unit 5 has a symmetry axis and this symmetry axis matches the optical axis Z of the light emitting module 3.

In addition, an outer side surface 5b of the second reflection unit 5 is subjected to desired surface processing so that the outer side surface 5b serves as a reflective surface capable of reflecting the light outgoing from the light emitting module 3. As the surface processing, for example, a surface processing such as mirror finishing may be used.

Further, the outer side surface 5b as the reflective surface is inclined with respect to the optical axis Z of the light emitting module 3 and an angle between the outer side surface 5b and the optical axis Z is an obtuse angle. That is, in the second reflection unit 5, a vertex of the circular cone is positioned on a mounted side of the light emitting module 3 and is positioned on the optical axis Z of the light emitting module 3. In other words, the light emitting module 3 is arrange in a manner such that the optical axis Z of the light emitting module 3 substantially matches the symmetry axis of the second reflection unit 5, and the outer side surface 5b serving as a reflective surface of the second reflection unit 5 is substantially rotationally symmetric about the optical axis of the light emitting module 3.

It is preferable that the second reflection unit 5 is constituted by a light non-transmissive material (material having a light non-transmission property) and totally reflects the light which is made go out from the light emitting module 3 and reaches the outer side surface 5*b* of the second reflection unit 5. In other words, a reflectance of the second reflection unit 5 is preferably 80% or more, 85% or more, 90% or more, and 95% or more. Additionally, it is preferably that the second reflection unit 5 is capable of specular reflection. For example, the second reflection unit 5 is constituted by a metal-based material such as aluminum and a resin-based material to which a reflection coating is applied. In this way, the higher the reflectance of the second reflection unit 5, the more increasing the light emitting efficiency of the spot lighting apparatus 1 itself, which is preferable. Note that the second reflection unit 5 does not necessarily have to have total reflection characteristics and may have a light transmission property to an extent that a bit of light is transmissive in a range of no problem due to the glare occurring.

The constitution of the second reflection unit 5 like this allows the second reflection unit 5 to directly receive (i.e., receive not via an optical member such as a lens) and reflect toward the first reflection unit 4 a part of the light released from the light emitting module 3.

Note that the shape of the second reflection unit 5 is not limited to the hollow conical shape, and may be various shapes so long as the optical property demanded for the spot lighting apparatus 1 can be met. In other words, the shape of the second reflection unit 5 can be adequately changed to conform to a demanded luminous intensity distribution shape. More specifically, the outer side surface 5*b* may be convexly or concavely curved, or may be merely conical without having the cavity 5*a*. Further, the shape of the second reflection unit 5 may be pyramidal or a shape that a cavity is defined in a pyramid (so-called hollow pyramidal shape).

(Fixing Unit)

As is seen from FIG. 1 and FIG. 5, the fixing unit 6 is constituted by an annular unit 6*a* that is positioned around the light emitting module 3 and the positioning member 7, and a strut 6*b* that extends from the annular unit 6*a* toward the outer side surface 5*b* of the second reflection unit 5. The constitution like this allows the fixing unit 6 to erect from the portion surrounding the mounted area of the light emitting module 3 and strongly couple the bottom part 4*a* of the first reflection unit 4 with the outer side surface 5*b* of the second reflection unit 5 at the portion surrounding the mounted area of the light emitting module 3.

The fixing unit 6 is constituted by, for example, resin having the light transmission property. Since the fixing unit 6 having the light transmission property, it is possible to prevent the light outgoing from the light emitting module 3 from being absorbed, improve the light emitting efficiency of the lighting apparatus, and maintain as designed an optical property of the light emitted from the spot lighting apparatus 1. Note that the fixing unit 6 may have the light reflectiveness without having the light transmission property.

By using the fixing unit 6 like this to fix the second reflection unit 5 to the first reflection unit 4, it is possible to prevent piece-to-piece variations of the product in a manufacturing process of the spot lighting apparatus 1, that is, prevent a distance between the light emitting module 3 and the second reflection unit 5 from being different from piece to piece (so-called product variations). Moreover, such a strong fixing can prevent fluctuation of the distance between the light emitting module 3 and the second reflection unit 5 caused by a physical or thermal shock. The spot lighting apparatus 1 according to the embodiment, which is made constant in a luminous intensity distribution property of the emitted light, can well illuminate with the more stable light.

In the embodiment, thanks to that the fixing unit 6 includes the annular unit 6*a*, the second reflection unit 5 can be easily mounted on the light emitting module 3 by means of the annular unit 6*a*. In other words, the annular unit 6*a* also serves as a positioning member for the second reflection unit. Note that so long as the second reflection unit 5 can be accurately mounted on the light emitting module 3, the strut 6*b* may be directly fixed to the bottom part 4*a* of the first reflection unit 4 without providing the annular unit 6*a*.

The constitution of the fixing unit 6 is not limited to the content described above, and may has a cylindrical or polygonal cylindrical outer shape. In a case like this, the fixing unit 6 is to be constituted by a material having the light transmission property, and one end of the cylindrically shaped fixing unit 6 may be arranged in a manner to surround an outer circumference of the light emitting module 3 and the other end thereof may be coupled with the outer side surface 5*b* of the second reflection unit 5.

In the embodiment, the annular unit 6*a* and the strut 6*b* which are made from the same material are formed into one body to constitute the fixing unit 6, but the annular unit 6*a* and the strut 6*b* may be constituted by different materials and joined by an adhesive or the like. In a case like this, depending on a condition such as a requirements specification of the spot lighting apparatus 1, the materials constituting the annular unit 6*a* and the strut 6*b* may be adequately changed, and an optimal aspect and cost reduction for the spot lighting apparatus 1 may be further attained.

Further, in the embodiment, the bottom part 4*a* of the first reflection unit 4 is couple with the outer side surface 5*b* of the second reflection unit 5 by the fixing unit 6, but the inner side surface 4*f* of the side surface part 4*b* of the first reflection unit 4 may be coupled with the outer side surface 5*b* of the second reflection unit 5. Such a coupling method allows the second reflection unit 5 to be certainly fixed to the first reflection unit 4 in a case where a contact space with the fixing unit 6 is not able to be secured on the bottom part 4*a* of the first reflection unit 4.

(Positioning Member)

As is seen from FIG. 1 and FIG. 5, the positioning member 7 is substantially annularly shaped and is arranged in a manner to surround a circumference of the light emitting module 3. In addition, the positioning member 7 is partially in contact with the chip mounting surface 11*a* of the flat plate unit 11 of the light emitting module 3 to fix the light emitting module 3 in manner to sandwich the module 3 between the member 7 and the first reflection unit 4. In other words, the positioning member 7 also serves as a fixing member for the light emitting module 3.

Additionally, as illustrated in FIG. 1, a screw hole 7*a* is formed on the positioning member 7. The screw hole 7*a* is to made to communicate with a screw hole (not illustrated) formed on the bottom part 4*a* of the first reflection unit 4 such that the positioning member 7 can be strongly fixed to the first reflection unit 4 and, at the same time, the light emitting module 3 can be strongly fixed to the first reflection unit 4 by screwing a screw (not illustrated) in the screw hole 7*a*.

The positioning member 7 is constituted by a material such as resin or metal, for example. Here, it is preferable that the material or surface finishing is given which can reflect the light reflected on the first reflection unit 4 and the second reflection unit 5 toward the first reflection unit 4 or the second reflection unit 5 without absorbing that light.

(Base)

As is seen from FIG. 3 to FIG. 5, the base 8 is planar and L-shaped so as to be inserted to be fitted into a power feeding mechanism for a lighting apparatus (not illustrated) provided to an installation location for the spot lighting apparatus 1 such as the ceiling. The base 8 is electrically connected with the circuit substrate 9 incorporated in the driver housing 2 via the wiring (not illustrated). Further, the base 8 is fixed to the driver housing 2 by screws 20. The structure like this allows a desired electric power to be supplied from the power feeding mechanism through the base 8 and the wiring to the circuit substrate 9 when the base 8 is inserted to be fitted into the power feeding mechanism for the lighting apparatus.

Note that the base 8 is not limited to be planar L-shaped as illustrated in FIG. 1, and its shape may be adequately changed to conform to the shape of the power feeding mechanism. For example, if a power feeding socket is a screw type socket that is general in Japan, the shape of base 8 may be a shape having the same dimensions as the substantially rectangular columnar portion of the driver housing 2 and having the surface thereof threaded. In a case like this, the base 8 is screwed on the power feeding socket to be detachable.

(Arrangement Relationship Between Light Emitting Module, First Reflection Unit, and Second Reflection Unit)

In the embodiment, in order to illuminate with a good spotlight from the spot lighting apparatus 1, an arrangement relationship between the light emitting module 3, the first reflection unit 4, and the second reflection unit 5 is adjusted to establish a desired relationship. Specifically, a light leak angle θt is not less than −7.0° and not more than 10.0°, the angle representing that the light released from the light emitting module 3 is directly released from the opening part 4e of the first reflection unit 4 without being reflected on the first reflection unit 4 and the second reflection unit 5. Preferably, the light leak angle θt may be not less than 0° and not more than 8.0°, and more preferably, the light leak angle θt may be not less than 0° and not more than 7.0°, further preferably not less than 4.0° and not more than 7.0°.

Here, in FIG. 5 (that is, in a sectional view including the optical axis of the light emitting module 3), an angle θ1 is formed between a first straight line c (depicted by an arrow) and an axis f (depicted by an arrow) where the first straight line c passes through a point a at an outer circumference portion of the light emitting face of the light emitting module 3 and a point b at an outer circumference portion of the first reflection unit 4 and the axis f is obtained by translating the optical axis Z of the light emitting module 3 in a manner to pass through the point a, and an angle θ2 is formed between a second straight line e (depicted by an arrow) and the axis f where the second straight line e passes through the point a at the outer circumference portion of the light emitting face of the light emitting module 3 and a point d at an outer circumference portion of the second reflection unit 5, and the light leak angle θt is defined by Formula (1) below using the angle θ1 and the angle θ2.

$$\theta t = \theta 1 - \theta 2 \quad (1)$$

Here, since the axis f is parallel with the optical axis Z, the angle θ1 described above is practically the same as an angle between the first straight line c and the optical axis Z of the light emitting module 3. In addition, the angle θ2 described above is also practically the same as an angle between the second straight line e and the optical axis Z of the light emitting module 3.

In the embodiment, it is preferable to adjust the arrangement relationship between the light emitting module 3, the first reflection unit 4, and the second reflection unit 5 so that the angle θ1 is to be not less than 40.0° and not more than 70.0°. Moreover, it is preferable to adjust the arrangement relationship between the light emitting module 3, the first reflection unit 4, and the second reflection unit 5 so that the angle θ2 is to be not less than 45.0° and not more than 60.0°.

Here, values of the light leak angle θt, θ1, and θ2 in the spot lighting apparatus 1 can be specified by directly measuring an actual product of the spot lighting apparatus 1, but may be found by disassembling the spot lighting apparatus 1 for measuring if the direct measuring is difficult, or by making a drawing (sectional view) from the actual product for measuring if the actual product is not able to be directly measured.

Note that the reason why the light leak angle θt, the angle θ1, and the angle θ2 are set to in a range of numerical values described above is because an optical path of the light emitted from the light emitting module 3 and a ratio of the lights passing through the optical path can be controlled to allow the good spotlight to be illuminated from the spot lighting apparatus 1. Note that this content is described in detail in combination with describing of comparison of Examples with Comparison examples described later.

Operation of Spot Lighting Apparatus

Figure 10:
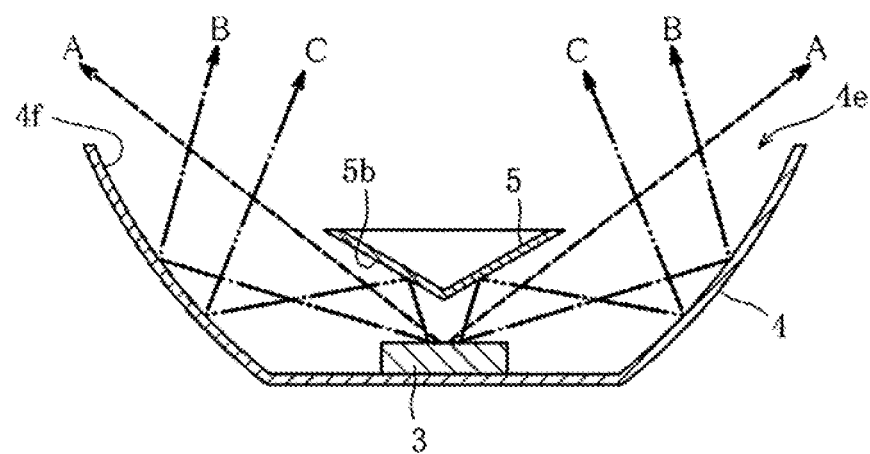
FIG. 10 is a schematic sectional view for explaining an operation of the spot lighting apparatus according to the embodiment.

Next, a description is given of an operation of the spot lighting apparatus 1 according to the embodiment and light emission in the operation with reference to FIG. 10. FIG. 10, which is a view for explaining the operation of the spot lighting apparatus according to the embodiment, is a schematic sectional view selectively depicting the light emitting module 3, the first reflection unit 4, and the second reflection unit 5.

First, the base 8 is inserted to be fitted into the power feeding mechanism (not illustrated) of a lighting system installed on the ceiling or the like and the edge part 4c of the first reflection unit 4 is hooked on an attachment mechanism part provided to an installation location on the ceiling to strongly attach the spot lighting apparatus 1 to the ceiling. In such a state, a power feeding switch of the lighting system is transited to an on state to feed the spot lighting apparatus 1 with the electric power. The electric power is supplied via the base 8, the circuit substrate 9 and the like to the light emitting module 3, the LED chips 13 in the light emitting module 3 emit the light, and then, a desired light is made to go out from light emitting module 3.

The optical path through which the light emitted from the light emitting module 3 is released from the opening part 4e of the spot lighting apparatus 1 mainly includes three patterns as illustrated in FIG. 10. A first pattern is an optical path A (depicted by a broken line) by way of which the light emitted from the light emitting module 3 is directly emitted from the opening part 4e through a gap between the first reflection unit 4 and the second reflection unit 5 without being reflected on the first reflection unit 4 nor the second reflection unit 5. A second pattern is an optical path B (depicted by a dash-single-dot line) by way of which the light emitted from the light emitting module 3 is first reflected one time on the inner side surface 4f of the first reflection unit 4, and thereafter, emitted from the opening part 4e. A third pattern is an optical path C (depicted by a dash-double-dot line in a case of two reflections and not illustrated in a case of three or more reflections) by way of which the light emitted from the light emitting module 3 directly or a light (not illustrated) reflected on the inner side surface 4f of the first reflection unit 4 is reflected on the outer side surface 5b of the second reflection unit 5, and thereafter, reflected on the inner side surface 4f of the first reflection unit 4, that is, through being reflected two or more times in total, and then, emitted from the opening part 4e. In addition, a part of the light emitted from the light emitting module 3 is repeatedly reflected within the spot lighting apparatus to be trapped in the spot lighting apparatus 1 without being emitted from the opening part 4e in some cases (not illustrated).

In the embodiment, in order to illuminate with a good spotlight from the spot lighting apparatus 1, the light reflected on the first reflection unit 4 and emitted from the opening part 4e is 80% or more of the total lights emitted from the opening part 4e. In other words, a total of the light emitted by way of the optical path B and the light emitted by way of the optical path C (including the light reflected on the first reflection unit 4 and the second reflection unit 5 three or more times in total, and then, emitted from the opening part 4e) is 80% or more of the lights emitted from the opening part 4e (a total of the lights by way of the optical path A, the optical path B, and the optical path C (including the light reflected on the first reflection unit 4 and the second reflection unit 5 three or more times in total, and then, emitted from the opening part 4e)). Here, in order to illuminate with the better spotlight, a ratio of the lights emitted by way of the optical paths B and C (including the light reflected on the first reflection unit 4 and the second reflection unit 5 three or more times in total, and then, emitted from the opening part 4e) (i.e., the numerical values describe above) may be preferably 85% or more, more preferably 90% or more, and particularly preferably 95% or more.

Here, in order to make the total of the lights which are emitted by way of the optical paths B and C be 80% or more of the total lights emitted from the opening part, adjusted are the dimensions and shapes of the light emitting module 3, first reflection unit 4, and second reflection unit 5, and a positional relationship between them. Particularly, there may be adjusted sizes of the first reflection unit 4 and second reflection unit 5 and the arrangement relationship between them, and angles between the reflective surfaces included in them and the optical axis of the semiconductor light emitting device, and further, there may be adjusted a shape of a lateral part of the first reflection unit 4, the opening diameter of the opening part 4e, dimensions of the second reflection unit 5 relative to the light emitting module 3, and the distance between the light emitting module 3 and the second reflection unit 5.

A ration of optical paths in an actual product of the lighting apparatus (e.g., the light reflected on the first reflection unit 4 and emitted from the opening part 4e is 80% or more of the total lights emitted from the opening part 4e) is found by making a 3D drawing from the actual product and simulating an optical path of the light emitted from the semiconductor light emitting device. As a calculation condition for simulation, the reflectance and handling of a light not reflected need to be set. For the reflectance which is different depending on the material of the reflection unit, a numerical value conforming to the material of the actual product is input. The light not reflected is handed as those to be absorbed. The simulation method itself may be any method, but examples of a representative simulation software may include Trace Pro (from Lambda Research Corporation). All of the simulations in Examples herein were calculated using this software is used.

In the embodiment, in order to illuminate with the better good spotlight from the spot lighting apparatus 1, the light reflected in order first on the second reflection unit 5 and next on the first reflection unit 4, and then, emitted from the opening part 4e is 50% or more of the total lights emitted from the opening part 4e. In other words, it is 50% or more of the lights emitted by way of the optical path C. Here, in order to illuminate with the better spotlight, a ratio of the lights emitted by way of the optical path C (i.e., the numerical values describe above) may be preferably 55% or more, more preferably 60% or more, and particularly preferably 65% or more.

Here, also in order to make the light which is reflected in order first on the second reflection unit 5 and next on the first reflection unit 4, and then, emitted from the opening part 4e be 50% or more of the total lights emitted from the opening part 4e, adjusted are the dimensions and shapes of the light emitting module 3, first reflection unit 4, and second reflection unit 5, and the positional relationship. Particularly, there may be adjusted a shape of the second reflection unit 5, the dimensions of the second reflection unit 5 relative to the light emitting module 3, and the distance between the light emitting module 3 and the second reflection unit 5.

Further, in the embodiment, in order to illuminate with the better good spotlight from the spot lighting apparatus 1, the light directly emitted from the opening part 4e without being reflected on the first reflection unit 4 nor the second reflection unit 5 is 20% or less of the total lights emitted from the opening part 4e. In other words, the light emitted by way of the optical path A is 20% or less of the light emitted from the opening part 4e (a total of the lights emitted from the opening part 4e by way of the optical path A, the optical path B, and the optical path C, and the light reflected on the first reflection unit 4 and the second reflection unit 5 three or more times in total, and then, emitted from the opening part 4e). Here, in order to illuminate with the better spotlight, a ratio of the lights emitted by way of the optical path A (i.e., the numerical values describe above) may be preferably 15% or less, more preferably 10% or less, and particularly preferably 5% or less.

Here, also in order to make the light which is directly emitted from the opening part 4e without being reflected on the first reflection unit 4 nor the second reflection unit 5 be 20% or less of the total lights emitted from the opening part 4e, adjusted are the dimensions and shapes of the light emitting module 3, first reflection unit 4, and second reflection unit 5, and the positional relationship. Particularly, there may be adjusted the opening diameter of the opening part 4e of the first reflection unit 4 relative to the light emitting face of the light emitting module 3, the dimensions of the second reflection unit 5 relative to the light emitting module 3, and the distance between the light emitting module 3 and the second reflection unit 5.

In the embodiment, in order to illuminate with the better spotlight from the spot lighting apparatus 1 to more brightly illuminate the object to be illuminated (i.e., in order to improve the light emitting efficiency of the spot lighting apparatus 1), of the lights outgoing from the light emitting module 3, a ratio of the lights trapped in the spot lighting apparatus 1 (the first reflection unit 4) without being emitted from the opening part 4e is 10% or less. Here, in order to further improve the light emitting efficiency of the spot lighting apparatus 1, the ratio of the lights trapped in the spot lighting apparatus 1 (i.e., the numerical values describe above) may be preferably 7% or less, and more preferably 5% or less.

Here, also in order to make the ratio of the lights trapped in the lighting apparatus be 10% or less, adjusted are the dimensions and shapes of the light emitting module 3, first reflection unit 4, and second reflection unit 5, and the positional relationship between them. Particularly, there may be adjusted the distance between the light emitting module 3 and the second reflection unit 5, and an angle between the reflective surface of the second reflection unit 5 and the optical axis of the light emitting module 3 to be an obtuse angle.

Base on the light emission described above, the spot lighting apparatus 1 according to the embodiment can emit the narrow-angle light in a more spotlight-like manner by increasing the lights passing through the optical paths B and C. In other words, in a case where the object to be illuminated which is about 50 cm or more distant is illuminated with the light by the spot lighting apparatus 1, an annular illuminated surface is not defined on the object to be illuminated, but a circular good illuminated surface is defined.

In addition, based on the light emission described above, the spot lighting apparatus 1 according to the embodiment, thanks to the reflection using the first reflection unit 4 the second reflection unit 5, can decrease the light to be trapped in the first reflection unit 4 or the light leaking from a lateral side of the first reflection unit 4 to improve the light emitting efficiency.

Further, in the spot lighting apparatus 1 according to the embodiment, since the light emitting module 3 is directly mounted on the bottom part 4a of the first reflection unit 4 having the thermal conductive path (including a case where a heat radiation material such as a heat radiation grease (for example, SE4490CV from Dow Corning Corporation) and a heat radiation sheet is sandwiched therebetween), the heat generated by driving the light emitting module 3 is conducted along the thermal conductive path for the first reflection unit 4 and radiated from the first reflection unit 4 without affecting the circuit substrate 9 in the driver housing 2. This allows the heat radiation property of the spot lighting apparatus 1 to be improved to prevent the light emitting module 3 and the circuit substrate 9 from getting out of order and lengthen the service life of the spot lighting apparatus 1 itself.

In the spot lighting apparatus 1 according to the embodiment, the heat radiation property improvement described above achieves high reliability without separately providing the heat sink. For this reason, the heat sink which is relatively weighty is eliminated so that the weight reduction of the spot lighting apparatus 1 itself is attained, and thus, the spot lighting apparatus 1 can be easily and strongly installed even at the higher position such as the ceiling.

As described above, in the spot lighting apparatus 1 according to the embodiment, many spot lighting apparatuses can be easily fixed to the higher position such as the ceiling, and a targeted object to be illuminated can be illuminated with a large luminous flux to perform an optimal optical presentation and lengthen the service life. That is, provided is the spot lighting apparatus 1 which emits the illuminating lights in a spotlight-like manner while aiming at the improvement of the light emitting efficiency, and has a sufficient heat radiation property while aiming at the weight reduction.

In the embodiment, the narrow-angle light refers to a light that a ½ beam angle of the light is not less than 5° and not more than 30°, and more preferably not less than 5° and not more than 25°. Here, the ½ beam angle of the light refers to an angle formed by beams between two directions as borders of beams where an illuminance ratio of the spot lighting apparatus 1 is 50% with respect to the maximum luminous intensity of spot lighting apparatus 1.

) In the embodiment, a measuring method of the ½ beam angle complies with "Measurement procedure of beam divergence" defined in "JIS C 8105-5". Specifically, first, the spot lighting apparatus 1 is attached such that a direction of the origin of the measurement conforms to a direction having the maximum luminous intensity of the spot lighting apparatus 1. However, the apparatus does not need to be attached in this manner if a luminous intensity distribution characteristic is complex.

Next, a vertical angle θ is varied while a horizontal angle $\varphi_1$ is made constant to measure a luminous intensity $I_t(\theta, \varphi_1)$ for each θ direction. Here, a method of measuring $I_t(\theta, \varphi_1)$ is as the following procedure. Specifically, a photometric center of the spot lighting apparatus 1 is made to conform to a rotational center of a goniophotometer, and a reference axis is also made to conform to the origin of measurement. Note that if there is another condition of an arrangement of the spot lighting apparatus 1 and the goniophotometer (condition specified by a manufacturer or the like), the other condition is to be complied with.

The spot lighting apparatus 1 is lighted under a condition of ordinary use, but if there is another condition (condition specified by a manufacturer or the like), the other condition is to be complied with. It is preferable that the spot lighting apparatus 1 and the goniophotometer are sufficiently preheated and confirmed to be stable. In order to confirm that the spot lighting apparatus 1 and the goniophotometer are stable, for example, the luminous intensity is measured every five minutes and if variation of the luminous intensities for continuous three measurements is 1% or less, it may be determined to be stable.

Next, an output from a photometer at each measurement point (θ, $\varphi_1$) is recorded, the measurement point being selected based on predetermined measurement angular range and measurement angular interval. If there is a monitoring photometer, an output from the photometer at each measurement point may be corrected in terms of a ratio to an output from the monitoring photometer. If a temperature affects an output from the photometer, a temperature at each measurement point is preferably recorded. A position where a temperature of the spot lighting apparatus 1 is measured is a position specified by a manufacturer or the like, and if no position is specified, it is preferable to measure at a position where a temperature and a measurement result thereof correlate.

Next, the recorded output from the photometer is used to calculate the luminous intensity $I_t(\theta, \varphi_1)$ at the measurement point (θ, $\varphi_1$). Specifically, in a case where calibration with luminous intensity is used for the goniophotometer, the luminous intensity I (θ, $\varphi_1$) is calculated by Formula (2) below.

$$I_t(\theta, \varphi_1) = k \times i_t(\theta, \varphi_1) \times R_1 \qquad (2)$$

Where, $I_t(\theta, \varphi_1)$ is an luminous intensity at a measurement point (θ, $\varphi_1$), k is a color correction factor, $i_t(\theta, \varphi_1)$ is an output from a photometer at the measurement point (θ, $\varphi_1$), and $R_1$ is a conversion factor of a luminous intensity of the photometer.

On the other hand, in a case where calibration with illuminance is used for the goniophotometer, the luminous intensity $I_t(\theta, \varphi_1)$ is calculated by Formula (3) below.

$$I_t(\theta, \varphi_1) = k \times i_t(\theta, \varphi_1) \times d^2 \times R_E \qquad (3)$$

Where, $I_t (\theta, \varphi_1)$ is a luminous intensity at a measurement point $I_t (\theta, \varphi_1)$, k is a color correction factor, $i_t (\theta, \varphi_1)$ is an output from a photometer at the measurement point $(\theta, \varphi_1)$, d is a photometric distance (m) from a measurement center of the spot lighting apparatus 1, $R_E$ is a conversion factor of a luminous intensity of the photometer. Note that the photometric distance is preferably five times or more a maximum dimension of the light emitting face of the spot lighting apparatus 1. For example, in the embodiment, a dimension of the opening part 4e of the first reflection unit 4 is 103 mm, and thus, the photometric distance of 1 m is sufficient.

After that, from $I_t (\theta, \varphi_1)$ obtained by the luminous intensity measurement described above, the maximum luminous intensity $I_{t,max} (\varphi_1)$ at the horizontal angle $\varphi$ is calculated. Then, as borders of beams, set are beams in two directions where a luminous intensity is 50% with respect to the maximum luminous intensity $I_{t,max} (\varphi_1)$ and an angle A $(\varphi_1)$ formed between the beam borders is found and set as a beam divergence. Note that in a case where an average beam divergence is found, A $(\varphi_1)$ may be measured for the horizontal angles $\varphi_1$ in two or more directions to obtain an average of A $(\varphi)$.

In the embodiment, the weight reduction of the spot lighting apparatus 1 and the light illumination with the large luminous flux are achieved by setting the luminous flux of the lights emitted from the opening part 4e per unit weight of the spot lighting apparatus 1 to 3.0 lumen/g or more.

As described above, by setting the ½ beam angle of the light emitted from the opening part 4e to be not less than 5° and not more than 30° and setting the luminous flux of the lights emitted from the opening part 4e per unit weight of the spot lighting apparatus 1 to 3.0 lumen/g or more, plural problems can be simultaneously attained such as the easiness and certainty of installation, the illumination with a large luminous flux in a spotlight-like manner, the optimal optical presentation, and the lengthened service life which have not been able to be achieved, exerting unprecedented effects.

Particularly, in the embodiment, the optimal aspect is to be aimed at by adjusting the number of reflections of the light emitted from the light emitting module 3 and a reflection ratio (i.e., a ratio of passing through the optical paths A to C), and adjusting the ½ beam angle of the light to be in a range of not less than 5° and not more than 30° depending on a requirements specification of the spot lighting apparatus 1. Moreover, the reflection structure constituted by the first reflection unit 4 and the second reflection unit 5 is used to reflect at least a part of the light outgoing from the light emitting module 3 two times to be emitted from the opening part 4e, and thereby, an optimal aspect of the beam angle is to be attained.

Comparison of Examples with Comparison Examples

Figure 11:
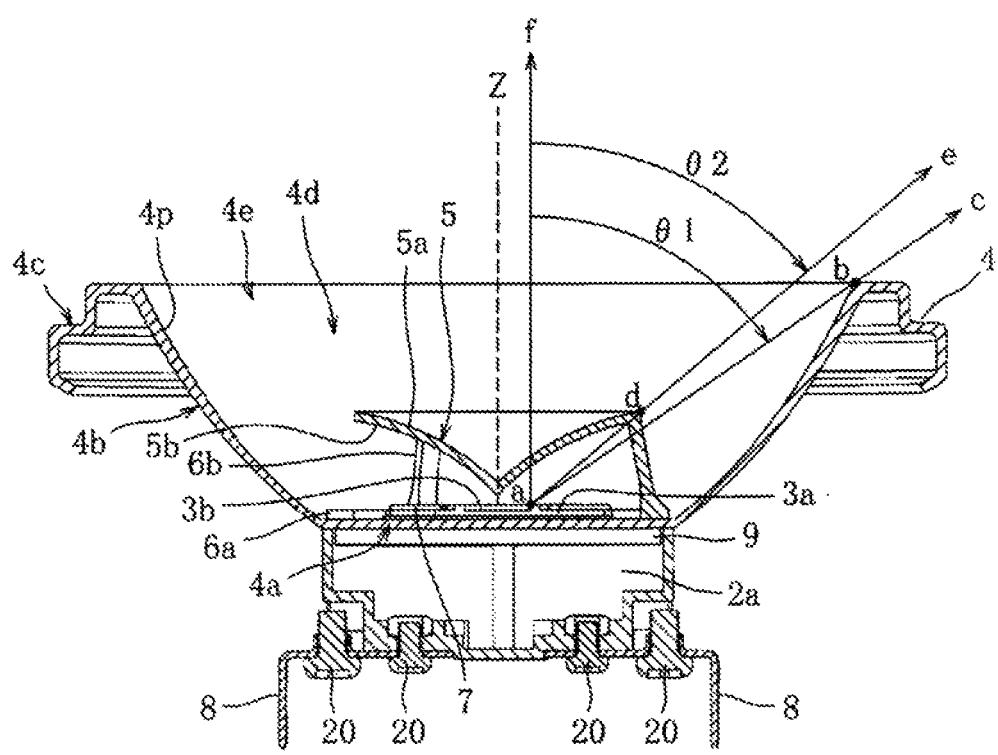
FIG. 11 is a sectional view of a spot lighting apparatus according to Example similar to the embodiment in FIG. 5.

Beam angles are compared by simulation of a AR111 type spot lighting apparatus (hereinafter, referred to as "Example") as illustrated in FIG. 11 which is subjected to the optical path adjustment as described above, and a lighting apparatus (hereinafter, referred to as "Comparison example") which is not subjected to the optical path unlike Example (i.e., many lights are emitted without being reflected on the first reflection unit and the second reflection unit), for example, a spot lighting apparatus, in Comparison example 2, having a constitution similar to a lighting apparatus illustrated in FIG. 5B of U.S. Pat. No. 6,637,921. Here, FIG. 11 is a sectional view of a spot lighting apparatus according to Example similar to the embodiment in FIG. 5. As Example described, Examples 1 to 4 were assumed which are slightly different in their constitutions owing to differences of the dimensions of the light emitting face of the light emitting module 3 and the dimensions of the second reflection unit 5 (i.e., the light leak angle) (in Example 4, a diameter of the second reflection unit is designed to be relatively larger compared to Examples 1 to 3 to decrease the light leak angle to a minus value). Further, in Comparison example 1, a modification example was assumed which is slightly different in its constitution owing to a difference of the dimensions of the light emitting face of the light emitting module.

In Example described above, as is seen from FIG. 11, a shape and arrangement position of the second reflection unit 5 and a length of the strut 6b are merely different as compared to the spot lighting apparatus 1 (illustrated in FIG. 1 to FIG. 5) according to the embodiment described above, and other constitution is the same. More specifically, the second reflection unit 5 according to Example has the outer side surface 5b curved to be concaved face-shaped, and is wholly formed into a substantially hollow conical shape. The strut 6b according to Example is set to be shorter than in the embodiment, and thereby, the second reflection unit 5 is arranged closer to the light emitting module 3.

The reflectances of the first reflection unit and second reflection unit were assumed to be 100% (complete reflection) for calculation. As the light emitting module, used was a COB (Chip On Board) type light emitting module having a total luminous flux of 1019 lumen.

Further, as for the first reflection unit 4 and the second reflection unit 5 defining the optical paths, the first reflection unit 4 was made from aluminum and the second reflection unit 5 was made from resin in both Example and Comparison example.

Similarly to FIG. 5, in FIG. 11 (that is, in a sectional view including the optical axis of the light emitting module 3), an angle θ1 is formed between a first straight line c (depicted by an arrow) and an axis f (depicted by an arrow) where the first straight line c passes through a point a at an outer circumference portion of the light emitting face of the light emitting module 3 and a point b at an outer circumference portion of the first reflection unit 4 and the axis f is obtained by translating the optical axis Z of the light emitting module 3 in a manner to pass through the point a, and an angle θ2 is formed between a second straight line e (depicted by an arrow) and the axis f where the second straight line e passes through the point a at the outer circumference portion of the light emitting face of the light emitting module 3 and a point d at an outer circumference portion of the second reflection unit 5, and the light leak angle θt can be defined by Formula (1) described above using the angle θ1 and the angle θ2.

As is illustrated by simulation evaluation results in FIG. 12, in Example 1, to all lights emitted from the light emitting module, a ratio of the lights passing through the optical path A was 1%, a ratio of the lights passing through the optical paths B and C was 96%, and a ratio of the lights trapped in the spot lighting apparatus (optical path D) was 3%. Additionally, to the lights passing through the optical paths A, B, and C (i.e., the lights emitted from the opening part 4e of the first reflection unit 4), a ratio of the lights passing through the optical paths B and C was 98.97%. Further, a light leak angle (θ1−θ2) was 0.6°. Then, a luminous flux of the lights emitted from opening part per unit weight was 5.2 lumen/g.

In Example 2, to all lights emitted from the light emitting module, a ratio of the lights passing through the optical path A was 6%, a ratio of the lights passing through the optical paths B and C was 89%, and a ratio of the lights trapped in the spot lighting apparatus (optical path D) was 5%. Additionally, to the lights passing through the optical paths A, B, and C, a ratio of the lights passing through the optical paths B and C was 93.68%. Further, a light leak angle (θ1−θ2) was 2.8°.

In Example 3, to all lights emitted from the light emitting module, a ratio of the lights passing through the optical path A was 9%, a ratio of the lights passing through the optical paths B and C was 85%, and a ratio of the lights trapped in the spot lighting apparatus (optical path D) was 6%. Additionally, to the lights passing through the optical paths A, B, and C, a ratio of the lights passing through the optical paths B and C was 90.43%. Further, a light leak angle (θ1−θ2) was 6.7°.

In Example 4, to all lights emitted from the light emitting module, a ratio of the lights passing through the optical path A was 0%, a ratio of the lights passing through the optical paths B and C was 94%, and a ratio of the lights trapped in the spot lighting apparatus (optical path D) was 6%. Additionally, to the lights passing through the optical paths A, B, and C, a ratio of the lights passing through the optical paths B and C was 100%. Further, a light leak angle (θ1−θ2) was −6.9° because θ2 was larger than θ1.

On the other hand, in Comparison example 1, to all lights emitted from the light emitting module, a ratio of the lights passing through the optical path A was 20%, a ratio of the lights passing through the optical paths B and C was 75%, and a ratio of the lights trapped in the spot lighting apparatus (optical path D) was 5%. Additionally, to the lights passing through the optical paths A, B, and C, a ratio of the lights passing through the optical paths B and C was 78.95%. Further, a light leak angle (θ1−θ2) was 19.5°.

In Comparison example 2, to all lights emitted from the light emitting module, a ratio of the lights passing through the optical path A was 30%, a ratio of the lights passing through the optical paths B and C was 66%, and a ratio of the lights trapped in the spot lighting apparatus was 4%. Additionally, to the lights passing through the optical paths A, B, and C, a ratio of the lights passing through the optical paths B and C was 68.75%.

From the above results, if θ1 and θ2 are adjusted to set the light leak angle θt to be not less than −7.0° and not more than 10.0°, the ratio of the lights passing through the optical paths B and C to the lights passing through the optical paths A, B, and C can be made to be 90% or more, which allows the good spotlight to be illuminated. On the other hand, if the light leak angle θt is around 20° as in Comparison example 1, the light directly emitted to the outside without being reflected on the reflection unit increases, which disables the good spotlight from being illuminated.

Figure 13:
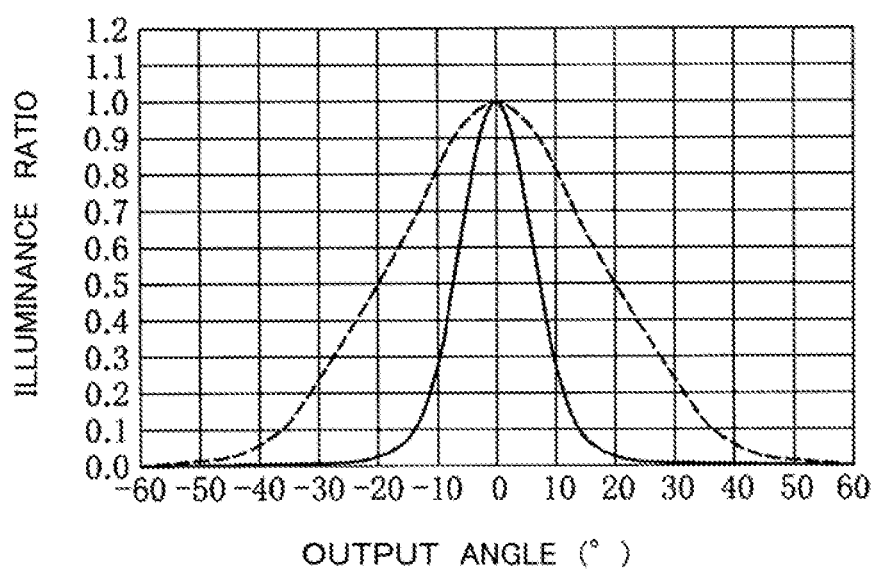
FIG. 13 is a graph representing a luminous intensity distribution of spot lighting apparatuses according to Example 1 and Comparison example 2.
Figure 14:
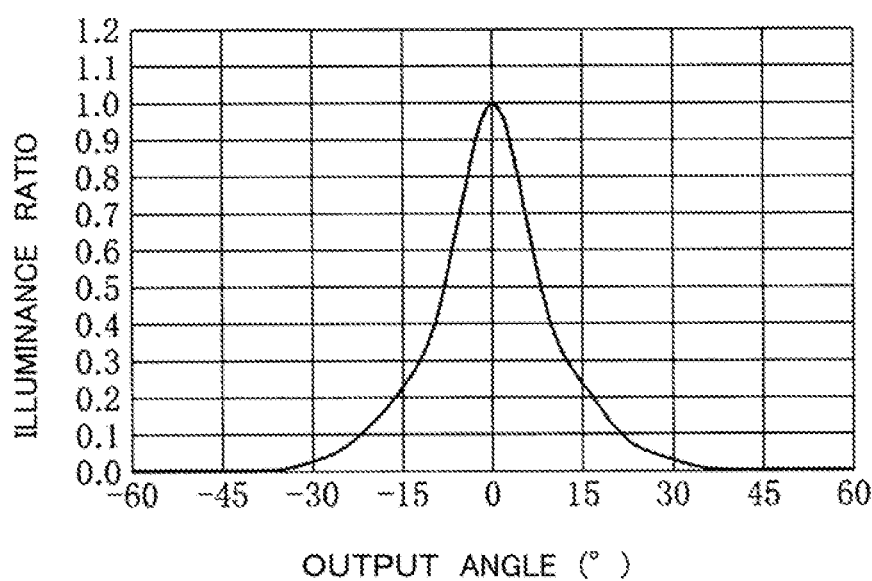
FIG. 14 is a graph representing a luminous intensity distribution of a spot lighting apparatus according to Example 2.
Figure 15:
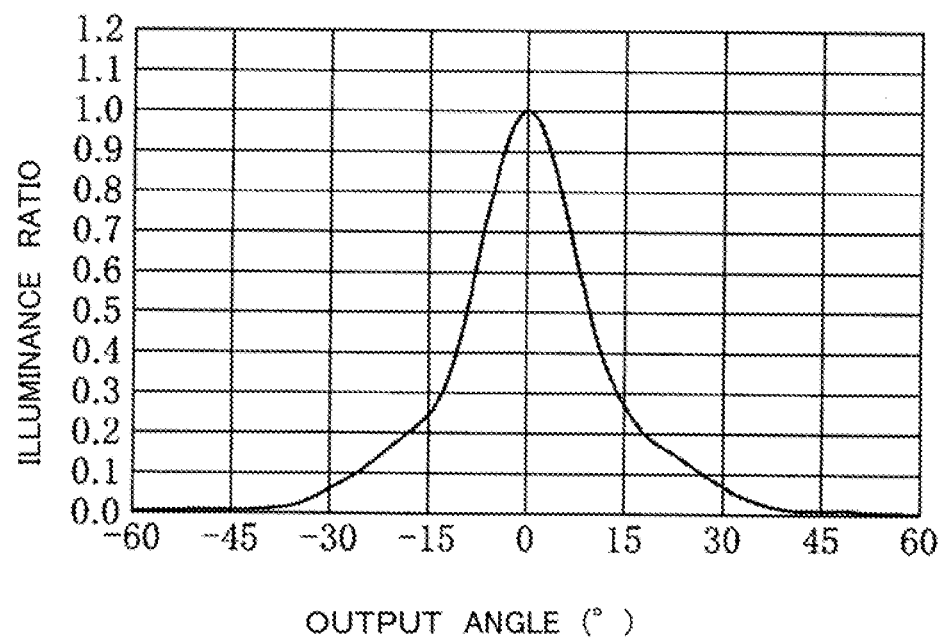
FIG. 15 is a graph representing a luminous intensity distribution of a spot lighting apparatus according to Example 3.
Figure 16:
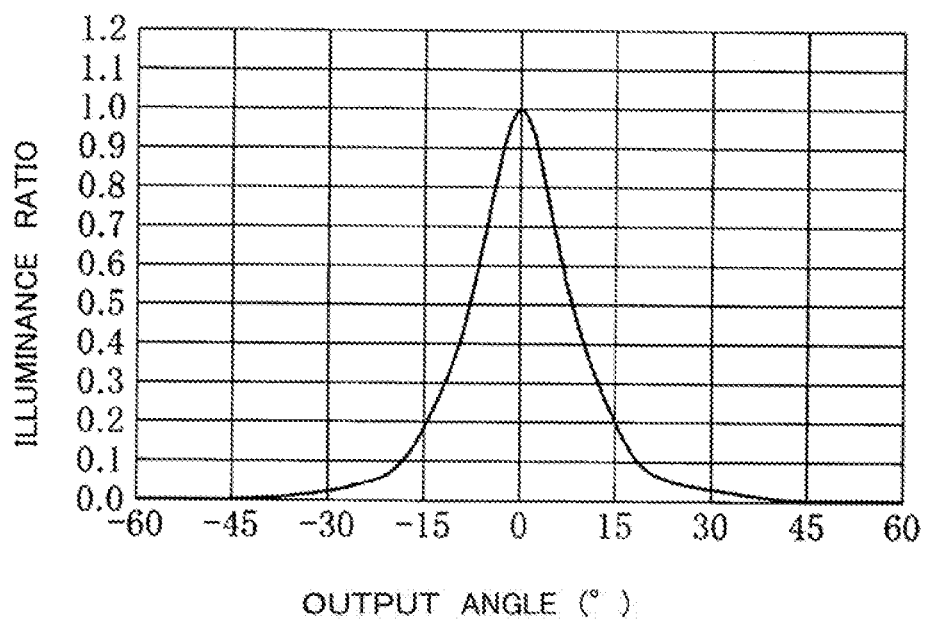
FIG. 16 is a graph representing a luminous intensity distribution of a spot lighting apparatus according to Example 4.
Figure 17:
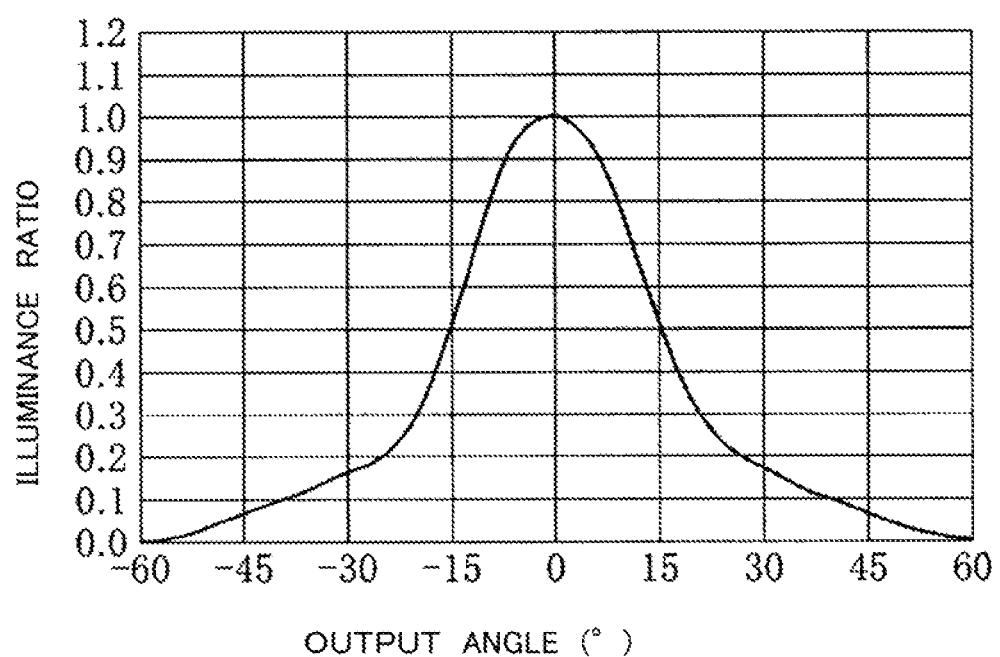
FIG. 17 is a graph representing a luminous intensity distribution of a spot lighting apparatus according to Comparison example 1.

Luminous intensity distributions in Example 1 and Comparison example 2 resulted in those as illustrated in FIG. 13. Further, a luminous intensity distribution in Example 2 resulted in those as illustrated in FIG. 14, a luminous intensity distribution in Example 3 resulted in those as illustrated in FIG. 15, and a luminous intensity distribution in Example 4 resulted in those as illustrated in FIG. 16. A luminous intensity distribution in Comparison example 1 resulted in those as illustrated in FIG. 17. Here, an abscissa in FIG. 13 to FIG. 17 represents an output angle (unit: degree (°)) and an ordinate represents an illuminance ratio.

As illustrated in FIG. 12 and FIG. 13, in the luminous intensity distribution in Example 1 (illustrated by a solid line in FIG. 13), the illuminance ratio sharply increased when the output angle was in a range of −15° to +15°, and a ½ beam angle was 13°. On the other hand, in the luminous intensity distribution in Comparison example 2 (illustrated by a broken line in FIG. 13), the illuminance ratio gently increased when the output angle was in a range of −50° to +50°, and a beam angle was 40° or more.

As illustrated in FIG. 12 and FIG. 14, in the luminous intensity distribution in Example 2, the illuminance ratio sharply increased when the output angle was in a range of −22° to +22°, and a ½ beam angle was 20°. Further, as illustrated in FIG. 12 and FIG. 15, in the luminous intensity distribution in Example 3, the illuminance ratio sharply increased when the output angle was in a range of −25° to +25°, and a ½ beam angle was 24°. Moreover, as illustrated in FIG. 12 and FIG. 16, in the luminous intensity distribution in Example 4, the illuminance ratio sharply increased when the output angle was in a range of −15° to +15°, and a ½ beam angle was 14°. On the other hand, as illustrated in FIG. 12 and FIG. 17, in the luminous intensity distribution in Comparison Example 1, the illuminance ratio sharply increased when the output angle was in a range of −45° to +45°, and a ½ beam angle was 30°.

From the luminous intensity distribution results above, Examples 1 to 4 can emit the good narrow-angle light as the spot lighting apparatus, but Comparison examples 1 and 2 are not able to emit such a narrow-angle light as Examples 1 to 4 and emit a wide-angle light that an illuminated range is relatively large. From the results like this, the spot lighting apparatus according to Examples 1 to 4 can emit the light of narrower angle than the spot lighting apparatus according to Comparison examples 1 and 2, and can illuminate the object to be illuminated with the illuminance needed even from a farther position and a higher position.

In addition, as illustrated in FIG. 12, the spot lighting apparatus according to Examples 1 to 4, in simulation reviewing, can have relatively a higher light emitting efficiency while emitting the narrow-angle light, and further did not generate unevenness on the illuminated surface. On the other hand, the spot lighting apparatus according to Comparison example 1 had the higher light emitting efficiency, but formed an overall blurry illuminated surface (that is, the light was of the obtuse angle and unevenness was generated on the illuminated surface).

Then, in order to represent that the above simulation results themselves are appropriate, an actual product of an AR111 type LED spot lighting apparatus corresponding to FIG. 11 was fabricated and actual measurement values were measured using the actual product. Here, the actual product was designed and fabricated such that a diameter of a light emitting face of a semiconductor light emitting device was 9 mm and a light leak angle θt was 4.7° (θ1=55.1°, θ2=50.4°). A ½ beam angle at that time was 21° as a result of actual measurement, and no unevenness was generated on the illuminated surface. These actual measurement results were found to be well consistent with the above simulation results.

What is claimed is:
1. A spot lighting apparatus, comprising:
    a bowl-shaped first reflection unit that has a bottom part, a side surface part, and an opening part facing the bottom part, wherein the bowl shaped first reflection unit is formed into one body;
    a semiconductor light emitting device that is provided on the bottom part of the first reflection unit;
    a second reflection unit that is provided on an optical axis of the semiconductor light emitting device; and
    a fixing unit that fixes the second reflection unit to be indirectly connected to but separated from the semiconductor light emitting device and the fixing unit surrounds the light emitting device and couples the bottom part of the first reflection unit with the outer side surface of the second reflection unit at the portion surrounding the mounted area of the light emitting device, wherein:

the second reflection unit receives a part of a light released from the semiconductor light emitting device and reflects it toward the first reflection unit;

the first reflection unit receives a part of a light released from the semiconductor light emitting device and all or a part of a light reflected on the second reflection unit and reflects them toward the opening part;

the spot lighting apparatus is configured to have a light leakage angle in the opening part; and the light reflected on the first reflection unit and emitted from the opening part is 80% or more of total lights emitted from the opening part.

2. The spot lighting apparatus according to claim 1, wherein:

a light emitting face of the semiconductor light emitting device, a reflective surface of the first reflection unit; and a reflective surface of the second reflection unit are substantially rotationally symmetric about the optical axis of the semiconductor light emitting device, and a light leak angle ($\theta t$) defined below is not less than $-7.0°$ and not more than $10.0°$, wherein the light leak angle ($\theta t=\theta 1-\theta 2$), where, ($\theta 1$) represents an angle between a first straight line and the optical axis of the semiconductor light emitting device, in a sectional view including the optical axis of the semiconductor light emitting device, the first straight line passing through a point at an outer circumference portion of the light emitting face of the semiconductor light emitting device and a point at an outer circumference portion of the first reflection unit, and ($\theta 2$) represents an angle between a second straight line and the optical axis of the semiconductor light emitting device, in the sectional view including the optical axis of the semiconductor light emitting device, the second straight line passing through the point at the outer circumference portion of the light emitting face of the semiconductor light emitting device and a point at an outer circumference portion of the second reflection unit.

3. The spot lighting apparatus according to claim 1, wherein a ½ beam angle of the light emitted from the opening part is not less than 5° and not more than 25°.

4. The spot lighting apparatus according to claim 1, wherein a luminous flux of the light emitted from the opening part per unit weight of the spot lighting apparatus is 3.0 lumen/g or more.

5. The spot lighting apparatus according to claim 1, wherein a light reflected in order first on the second reflection unit and next on the first reflection unit, and then, emitted from the opening part is 50% or more of the total lights emitted from the opening part.

6. The spot lighting apparatus according to claim 1, wherein neither a light directly emitted from the opening part without being reflected on the first reflection unit nor the second reflection unit is 20% or less of the total lights emitted from the opening part.

7. The spot lighting apparatus according to claim 1, wherein, within lights released from the semiconductor light emitting device, a ratio of lights trapped in the spot lighting apparatus without being emitted from the opening part is 10% or less.

8. The spot lighting apparatus according to claim 2, which is configured to have the light leak angle ($\theta t$) is from 4° to 7° in the opening part.

9. The spot lighting apparatus according to claim 1, wherein the first reflection unit has a symmetry axis.

10. The spot lighting apparatus according to claim 9, wherein the semiconductor light emitting device is provided in a manner such that optical axis substantially matches the symmetry axis of the first reflection unit.

11. The spot lighting apparatus according to claim 1, wherein the fixing unit extends beyond the outer perimeter of the second reflecting unit.

12. The spot lighting apparatus according to claim 1, further comprising a positioning member that positions the light emitting module with respect to the first reflection unit.

13. The spot lighting apparatus according to claim 1, which emits at least one path of light that is not a reflected light emission.

14. A spot lighting apparatus, comprising:

a bowl-shaped first reflection unit that has a bottom part, a side surface part, and an opening part facing the bottom part, wherein the bowl shaped first reflection unit is formed into one body;

a semiconductor light emitting device that is provided on the bottom part of the first reflection unit;

a second reflection unit that is provided on an optical axis of the semiconductor light emitting device; and a fixing unit that fixes the second reflection unit to be indirectly connected to but separated from the semiconductor light emitting device and the fixing unit surrounds the light emitting device and couples the bottom part of the first reflection unit with the outer side surface of the second reflection unit at the portion surrounding the mounted area of the light emitting device, wherein:

the second reflection unit receives a part of a light released from the semiconductor light emitting device and reflects it toward the first reflection unit;

the first reflection unit receives a part of a light released from the semiconductor light emitting device and all or a part of a light reflected on the second reflection unit and reflects them toward the opening part;

a light emitting face of the semiconductor light emitting device, a reflective surface of the first reflection unit, and a reflective surface of the second reflection unit are substantially rotationally symmetric to the optical axis of the semiconductor light emitting device; and a light leak angle ($\theta t$) defined below is not less than $-7.0°$ and not more than $10.0°$, wherein the light leak angle ($\theta t=\theta 1-\theta 2$), where, ($\theta 1$) represents an angle between a first straight line and the optical axis of the semiconductor light emitting device, in a sectional view including the optical axis of the semiconductor light emitting device, the first straight line passing through a point at an outer circumference portion of the light emitting face of the semiconductor light emitting device and a point at an outer circumference portion of the first reflection unit, and ($\theta 2$) represents an angle between a second straight line and the optical axis of the semiconductor light emitting device, in the sectional view including the optical axis of the semiconductor light emitting device, the second straight line passing through the point at the outer circumference portion of the light emitting face of the semiconductor light emitting device and a point at an outer circumference portion of the second reflection unit.

15. The spot lighting apparatus according to claim 14, wherein the (θ1) is not less than 40.0° and not more than 70.0°.

16. The spot lighting apparatus according to claim 14, wherein the (θ2) is not less than 45.0° and not more than 60.0°.

17. The spot lighting apparatus according to claim 14, wherein the side surface part of the first reflection unit is formed substantially into a shape of a paraboloid of revolution.

18. The spot lighting apparatus according to claim 14, wherein the first reflection unit includes a thermal conductive path that radiates a heat generated from the semiconductor light emitting device from the bottom part toward the side surface part.

19. The spot lighting apparatus according to claim 14, wherein the second reflection unit has a symmetry axis.

20. The spot lighting apparatus according to claim 14, wherein the reflective surface of the second reflection unit is inclined with respect to the optical axis of the semiconductor light emitting device, and an angle formed between the reflective surface of the second reflection unit and the optical axis of the semiconductor light emitting device is an obtuse angle.

21. A spot lighting apparatus, comprising:
a semiconductor light emitting device;
a reflection structure that mounts the semiconductor light emitting device on a bottom part, and reflects at least a part of the light emitted from the semiconductor light emitting device and emits the light from an opening part that is positioned on an opposite side of the bottom part, and
a fixing unit that comprises air and that surrounds the light emitting device and couples a bottom part of a first reflection unit with an outer side surface of a second reflection unit at a portion surrounding the mounted area of the light emitting device,
wherein a ½ beam angle of the light emitted from the opening part is not less than 5° and not more than 30°, and a luminous flux of the light emitted from the opening part per unit weight of the spot lighting apparatus is 5.0 lumen/g or more; and
wherein the spot lighting apparatus is configured to have a light leak angle (θt) of from 4° to 7° in the opening part.

22. The spot lighting apparatus according to claim 21, wherein, the reflection structure reflects at least a part of the light emitted from the semiconductor light emitting device two times to be emitted from the opening part.

23. The spot lighting apparatus according to claim 21, wherein the reflection structure directly radiates a heat generated from the semiconductor light emitting device.

24. The spot lighting apparatus according to claim 21, wherein the reflection structure suppresses fluctuation of a distance between the semiconductor light emitting device and a reflective surface of the reflection structure caused by a physical or thermal shock.

* * * * *